United States Patent
Newman

(10) Patent No.: US 10,090,432 B2
(45) Date of Patent: Oct. 2, 2018

(54) PHOTOACTIVE DEVICES HAVING LOW BANDGAP ACTIVE LAYERS CONFIGURED FOR IMPROVED EFFICIENCY AND RELATED METHODS

(71) Applicant: Soitec, Crolles (FR)

(72) Inventor: Fred Newman, Maricopa, AZ (US)

(73) Assignee: SOITEC, Bernin (FR)

( * ) Notice: Subject to any disclaimer, the term of this patent is extended or adjusted under 35 U.S.C. 154(b) by 0 days.

(21) Appl. No.: 14/768,976

(22) PCT Filed: Feb. 21, 2014

(86) PCT No.: PCT/IB2014/000211
§ 371 (c)(1),
(2) Date: Aug. 19, 2015

(87) PCT Pub. No.: WO2014/135944
PCT Pub. Date: Sep. 12, 2014

(65) Prior Publication Data
US 2016/0005909 A1     Jan. 7, 2016

Related U.S. Application Data

(60) Provisional application No. 61/774,742, filed on Mar. 8, 2013.

(51) Int. Cl.
*H01L 31/18*     (2006.01)
*H01L 31/0236*     (2006.01)
(Continued)

(52) U.S. Cl.
CPC ........ *H01L 31/1892* (2013.01); *H01L 31/028* (2013.01); *H01L 31/02363* (2013.01);
(Continued)

(58) Field of Classification Search
CPC . H01L 31/18; H01L 31/1852; H01L 31/1892; H01L 31/1896; Y02E 10/50
(Continued)

(56) References Cited

U.S. PATENT DOCUMENTS 3,615,855 A * 10/1971 Smith ................. H01L 31/00
                                                     136/255
6,303,468 B1    10/2001 Aspar et al.
(Continued)

FOREIGN PATENT DOCUMENTS

FR        1159154 A     6/1958
JP        05206491 A2   8/1993
(Continued)

OTHER PUBLICATIONS

Aiken et al., Temperature Dependent Spectral Response Measurements for III-V Multi-Junction Solar Cells, Photovoltaic Specialists Conference, 2002. Conference Record of the Twenty-Ninth IEEE, May 19-24, 2002, pp. 828-831.
(Continued)

*Primary Examiner* — Lindsey Bernier
(74) *Attorney, Agent, or Firm* — TraskBritt

(57) ABSTRACT

Photoactive devices include an active region disposed between first and second electrodes and configured to absorb radiation and generate a voltage between the electrodes. The active region includes an active layer comprising a semiconductor material exhibiting a relatively low bandgap. The active layer has a front surface through which radiation enters the active layer and a relatively rougher back surface on an opposing side of the active layer. Methods of fabricating photoactive devices include the formation of such an active region and electrodes.

16 Claims, 13 Drawing Sheets

(51) Int. Cl.
  *H01L 31/0687* (2012.01)
  *H01L 31/056* (2014.01)
  *H01L 31/028* (2006.01)
(52) U.S. Cl.
  CPC ........ *H01L 31/056* (2014.12); *H01L 31/0687* (2013.01); *H01L 31/06875* (2013.01); *H01L 31/186* (2013.01); *H01L 31/1808* (2013.01); *Y02E 10/52* (2013.01); *Y02E 10/544* (2013.01)
(58) Field of Classification Search
  USPC ........................................ 438/57, 71, 74, 87
  See application file for complete search history.

(56) References Cited

U.S. PATENT DOCUMENTS

| | | | |
|---|---|---|---|
| 6,316,715 | B1* | 11/2001 | King .................. H01L 31/0304 136/249 |
| 6,335,258 | B1 | 1/2002 | Aspar et al. |
| 6,756,286 | B1 | 6/2004 | Moriceau et al. |
| 6,809,044 | B1 | 10/2004 | Aspar et al. |
| 6,946,365 | B2 | 9/2005 | Aspar et al. |
| RE39,484 | E | 2/2007 | Bruel |
| 7,339,109 | B2 | 3/2008 | Stan et al. |
| 7,785,989 | B2 | 8/2010 | Sharps et al. |
| 8,187,907 | B1 | 5/2012 | Newman |
| 2002/0117675 | A1 | 8/2002 | Mascarenhas |
| 2002/0190269 | A1* | 12/2002 | Atwater, Jr. .......... H01L 21/187 257/184 |
| 2006/0112986 | A1* | 6/2006 | Atwater, Jr. ........ H01L 31/0687 136/255 |
| 2008/0000522 | A1* | 1/2008 | Johnson .............. H01L 31/0747 136/255 |
| 2009/0078309 | A1 | 3/2009 | Cornfeld et al. |
| 2009/0078311 | A1 | 3/2009 | Stan et al. |
| 2009/0188561 | A1 | 7/2009 | Aiken et al. |
| 2009/0229658 | A1 | 9/2009 | Stan et al. |
| 2009/0229662 | A1 | 9/2009 | Stan et al. |
| 2010/0012174 | A1 | 1/2010 | Varghese et al. |
| 2010/0122764 | A1 | 5/2010 | Newman |
| 2010/0151618 | A1 | 6/2010 | Sharps et al. |
| 2010/0206365 | A1 | 8/2010 | Chumney et al. |
| 2010/0229926 | A1 | 9/2010 | Newman et al. |
| 2010/0282305 | A1 | 11/2010 | Sharps et al. |
| 2010/0282306 | A1 | 11/2010 | Sharps et al. |
| 2010/0282307 | A1 | 11/2010 | Sharps et al. |
| 2011/0045611 | A1 | 2/2011 | Castex et al. |
| 2011/0248265 | A1* | 10/2011 | Forbes .............. H01L 31/02363 257/51 |
| 2012/0186641 | A1 | 7/2012 | Sharps et al. |

FOREIGN PATENT DOCUMENTS

| | | |
|---|---|---|
| JP | 2005268482 A2 | 9/2005 |
| JP | 2012256776 A2 | 12/2012 |
| WO | 2009096932 A1 | 8/2009 |

OTHER PUBLICATIONS

Arena et al., U.S. Appl. No. 61/580,085, filed Dec. 23, 2011 and titled, Methods of Forming Dilute Nitride Materials for Use in Photoactive Devices and Related Structures.
Bain et al., Germanium on Sapphire by Wafer Bonding, Solid State Electronics, vol. 52, (2008), pp. 1840-1844.
International Search Report for International Application No. PCT/IB2014/000211 dated Jun. 16, 2014, 3 pages.
International Written Opinion for International Application No. PCT/IB2014/000211 dated Jun. 16, 2014, 4 pages.
Perova et al., Investigation of Germanium Implanted with Hydrogen for Layer Transfer Applications, Solid State PHenomena, vols. 178-179, (2011), pp. 295-300.
Yamaguchi et al., Multi-Junction III-V Solar Cells: Current Status and Future Potential, Solar Energy, vol. 79, (2005), pp. 78-85.
Zahler et al, Wafer Bonding and Layer Transfer Processes for 4-Junction High Efficiency Solar Cells, Photovoltaic Specialists Conference, 2002. Conference Record of the Twenty-Ninth IEEE, (2002), pp. 1039-1042.
Chinese First Notification of Office Action for Application No. 201480012914.8 dated Sep. 1, 2016, 12 pages.
Taiwanese Office Action and Search Report for Taiwanese Application No. 103105536 dated May 1, 2017, 11 pages.
Chinese Second Notification of Office Action for Application No. 201480012914.8 dated Feb. 27, 2017, 20 pages.
Chinese Third Notification of Office Action for Application No. 201480012914.8 dated Jul. 20, 2017, 20 pages.
Notice of Reasons for Rejection for Japanese Patent Application No. 2015-560795, dated Dec. 12, 2017, 3 pages.

* cited by examiner

PHOTOACTIVE DEVICES HAVING LOW BANDGAP ACTIVE LAYERS CONFIGURED FOR IMPROVED EFFICIENCY AND RELATED METHODS

CROSS-REFERENCE TO RELATED APPLICATIONS

This application is a national phase entry under 35 U.S.C. § 371 of International Patent Application PCT/IB2014/000211, filed Feb. 21, 2014, designating the United States of America and published in English as International Patent Publication WO 2014/135944 A1 on Sep. 12, 2014, which claims the benefit under Article 8 of the Patent Cooperation Treaty under 35 U.S.C. § 119(e) to U.S. Provisional Patent Application Ser. No. 61/774,742, filed Mar. 8, 2013, the disclosure of each of which is hereby incorporated herein in its entirety by this reference.

TECHNICAL FIELD

Embodiments of the present disclosure relate to photoactive devices, and to methods of fabricating photoactive devices.

BACKGROUND

Photoactive devices are semiconductor devices that employ semiconductor material to convert electromagnetic radiation into electrical energy or to convert electrical energy into electromagnetic radiation. Photoactive devices include, for example, photovoltaic cells, photosensors, light-emitting diodes, and laser diodes.

Photovoltaic cells (also referred to in the art as "solar cells" or "photoelectric cells") are used to convert energy from light (e.g., sunlight) into electricity. Photovoltaic cells generally include one or more pn junctions, and can be manufactured using conventional semiconductor materials, such as silicon, germanium, and III-V semiconductor materials. Photons from impinging electromagnetic radiation (e.g., light) are absorbed by the semiconductor material proximate the pn junction, resulting in the generation of electron-hole pairs. The electrons and holes generated by the impinging radiation are driven in opposite directions by a built-in electric field across the pn junction, resulting in a voltage between the n region and the p region on opposing sides of the pn junction. This voltage may be used to produce electricity. Defects in the crystal lattices of the semiconductor materials at the pn junctions provide locations at which electrons and holes previously generated by absorption of radiation can recombine, thereby reducing the efficiency by which the radiation is converted into electricity by the photovoltaic cells.

The photons of the electromagnetic radiation that impinge on a photovoltaic cell must have sufficient energy to overcome the bandgap energy of the semiconductor material to generate an electron-hole pair. Thus, the efficiency of the photovoltaic cell is dependent upon the percentage of the impinging photons that have an energy corresponding to the bandgap energy of the semiconductor material. Stated another way, the efficiency of the photovoltaic cell is at least partially dependent upon the relationship between the wavelength or wavelengths of the radiation impinging on the photovoltaic cell and the bandgap energy of the semiconductor material. Sunlight is emitted over a range of wavelengths. As a result, photovoltaic cells have been developed that include more than one pn junction, wherein each pn junction comprises semiconductor material having a different bandgap energy so as to capture light at different wavelengths and increase the efficiencies of the photovoltaic cells. Such photovoltaic cells are referred to as "multi-junction" or "MJ" photovoltaic cells.

Thus, the efficiency of a multi junction photovoltaic cell may be increased by selecting the semiconductor materials at the pn junctions to have band-gap energies that are aligned with the wavelengths of light corresponding to the wavelengths of highest intensity in the light to be absorbed by the photovoltaic cells, and by decreasing the concentration of defects in the crystal lattices of the semiconductor materials at the pn junctions. One way to decrease the concentration of defects in the crystal lattices of the semiconductor materials is to employ semiconductor materials that have lattice constants and coefficients of thermal expansion that are closely matched with one another.

Previously known multi junction photovoltaic cells are relatively inefficient in conversion of electromagnetic radiation at wavelengths in the range extending from about 1,550 nm to about 1,800 nm. For example, it is known to employ a pn junction in a germanium (Ge) cell in a multi junction photovoltaic cell. As disclosed in, for example, M. Yamaguchi et al., *Multi-junction III-V solar cells: current status and future potential*, Solar Energy 79, pp. 78-85 (2005), and D. Aiken et al., Temperature Dependent Spectral Response Measurements for III-V Multi-Junction Solar Cells, Emcore Photovoltaics, 10420 Research Rd. SE, Albuquerque, N. Mex. 87123, the external quantum efficiency of such multi junction photovoltaic cells drops for wavelengths longer than about 1,650 nm. Without being bound to any particular theory, it is currently believed that this drop in external quantum efficiency is at least partially due to the fact that optical coupling between the photons of such radiation wavelengths and electrons in the Ge crystal lattice in the Ge cell involves an indirect electronic transition between the conduction band and the valence band. In addition to the photon and electron, the optical coupling process requires a phonon to conserve momentum. Due to the requirement of the phonon to conserve momentum, the indirect electronic transition process leads to a low optical absorption coefficient for photons having wavelengths greater than about 1,650 nm, and such photons are likely to be absorbed only after passing through a sufficient physical thickness of Ge.

Additionally, previously known Ge solar cells often include Ge formed on a heavily doped p-type substrate. As a result, the minority carrier (electron) diffusion length within the Ge is shorter than the actual physical thickness of the Ge layer in which the pn junction is foamed. As a result, most photons having wavelengths greater than about 1,650 nm do not generate electrons that can diffuse a sufficient distance to an electrode prior to undesirable recombination with an electron hole, and thus cannot contribute to the photocurrent of the photovoltaic cell.

BRIEF SUMMARY

This summary is provided to introduce a selection of concepts in a simplified form. These concepts are described in further detail in the detailed description of example embodiments of the disclosure below. This summary is not intended to identify key features or essential features of the claimed subject matter, nor is it intended to be used to limit the scope of the claimed subject matter.

In some embodiments, the present disclosure includes photoactive devices that include a first electrode, a second electrode, and an active region disposed between the first electrode and the second electrode. The active region is configured to absorb radiation impinging on the active region and to generate a voltage between the first electrode and the second electrode responsive to absorption of radiation. The active region includes at least one active layer comprising a semiconductor material exhibiting a bandgap of between about 0.60 eV and about 2.10 eV. The at least one active layer has a front surface through which radiation enters the at least one active layer during operation of the photoactive device and a back surface on an opposing side of the at least one active layer from the front surface. The back surface of the at least one active layer has a surface roughness greater than a surface roughness of the front surface.

In additional embodiments, the present disclosure includes methods of fabricating photoactive devices. In accordance with such methods, an active region may be formed and configured to absorb radiation impinging on the active region and to generate a voltage between a first electrode and a second electrode responsive to absorption of radiation. The active region of the photoactive device may be formed to include at least one active layer comprising a semiconductor material exhibiting a bandgap of between about 0.60 eV and about 2.10 eV. The at least one active layer may be formed to have a front surface through which radiation enters the at least one active layer during operation of the photoactive device and a back surface on an opposing side of the at least one active layer from the front surface. The back surface may be formed to have a surface roughness greater than a surface roughness of the front surface. The methods further include formation of the first electrode and the second electrode between which a voltage is generated responsive to absorption of radiation impinging on the active region.

BRIEF DESCRIPTION OF THE DRAWINGS

FIG. 5 illustrates implantation of ions into a donor structure comprising a semiconductor material.

FIG. 6 illustrates the structure of FIG. 5 directly bonded to a surface of a first substrate.

FIG. 7 illustrates a structure formed by cleaving the donor structure as shown in FIG. 6 along an ion implant plane to transfer a layer of semiconductor material from the donor structure to the first substrate.

FIG. 8 illustrates the fabrication of an active layer comprising germanium (Ge) with a pn junction therein on the first substrate.

FIG. 9 illustrates a multi junction photoactive device formed by fabricating additional active layers over the active layer comprising Ge shown in FIG. 8.

FIG. 10 illustrates a second substrate attached to the multi junction photoactive device of FIG. 9 on a side thereof opposite the first substrate.

FIG. 11 illustrates a structure formed by removing the first substrate from the structure of FIG. 10 to expose a back surface of an active layer (and illustrates the structure inverted relative to the perspective of FIG. 11).

FIG. 12 illustrates a structure formed by roughening the exposed back surface of the active layer of FIG. 11, and subsequently depositing an electrically conductive layer of material over the roughened back surface.

FIG. 13 illustrates a structure formed by thickening the electrically conductive layer of material over the roughened back surface shown in FIG. 12.

FIG. 14 illustrates a multi junction photoactive device that may be formed from the structure of FIG. 13 by completing formation of a first electrode over the thickened electrically conductive layer, removing the second substrate, and providing a second electrode on an opposing side of an active region of the multi junction photoactive device from the first electrode.

FIG. 15 illustrates a first multi-layer structure formed by growing additional layers of an active region on the structure of FIG. 8.

FIG. 16 illustrates a second multi-layer structure formed by growing multiple layers of an active region on a second substrate.

DETAILED DESCRIPTION

The illustrations presented herein are not meant to be actual views of any particular photoactive device or component thereof, but are merely idealized representations that are used to describe embodiments of the disclosure.

As used herein, the term "III-V semiconductor material" means and includes any semiconductor material that is at least predominantly comprised of one or more elements from group IIIA of the periodic table (B, Al, Ga, In, and Ti) and one or more elements from group VA of the periodic table (N, P, As, Sb, and Bi). For example, III-V semiconductor materials include, but are not limited to, GaN, GaP, GaAs, InN, InP, InAs, AlN, AlP, AlAs, InGaN, InGaP, GaInN, InGaNP, GaInNAs, etc.

In accordance with embodiments of the present disclosure, photoactive devices include an active region disposed between electrodes, wherein the active region includes an active layer comprising a semiconductor material exhibiting a bandgap of between about 0.60 eV and about 2.10 eV, and, in some embodiments, between about 0.60 eV and about 1.20 eV, or even between about 0.60 eV and about 1.20 eV. The active layer having such a bandgap may also have a back surface having a surface roughness greater than a surface roughness of a front surface of the active layer. Non-limiting examples of such photoactive devices are described below with reference to FIGS. 1 through 4, and embodiments of methods that may be employed to fabricate such photoactive devices including are described below with reference to FIGS. 5 through 16.

Figure 1:
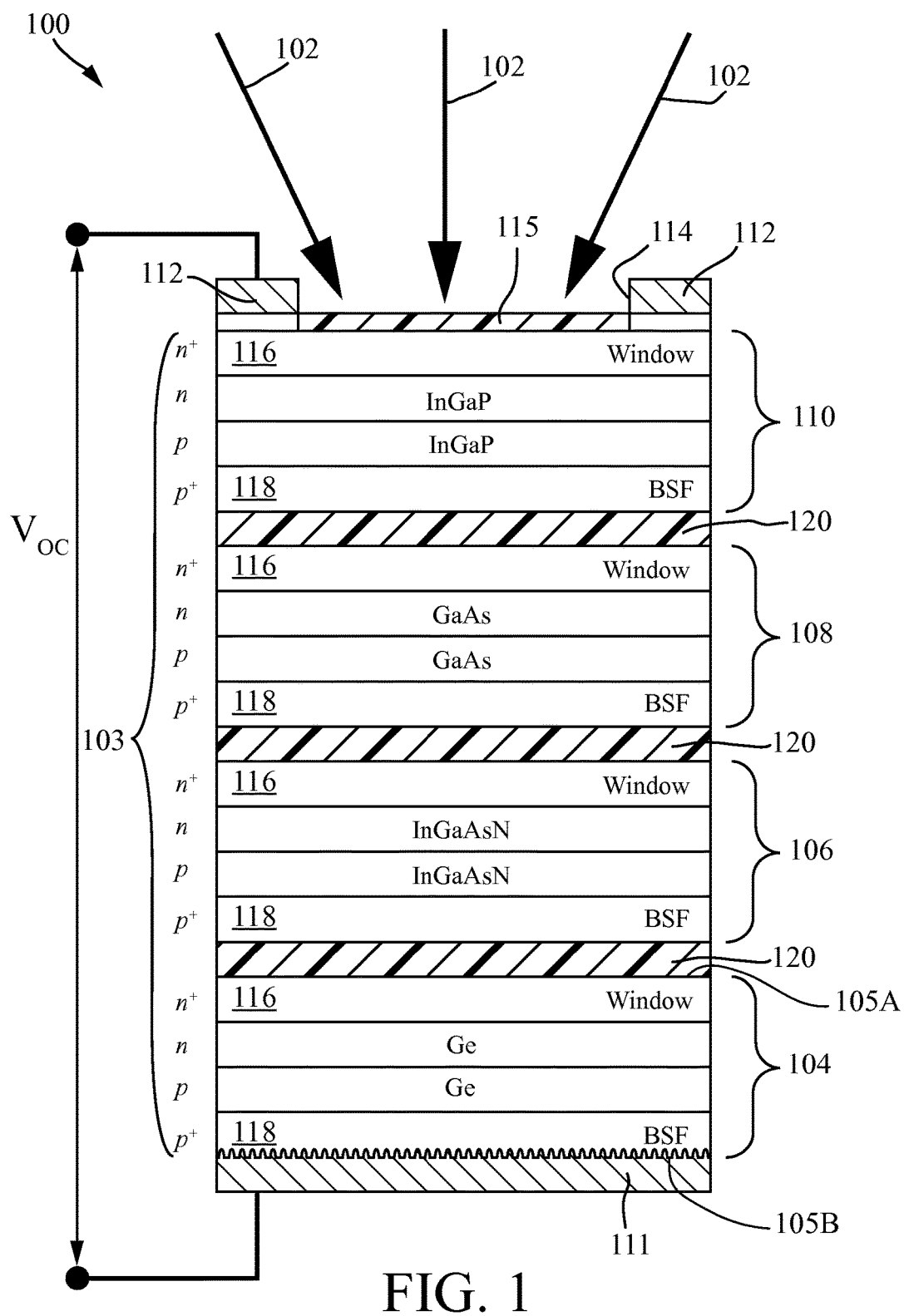
FIG. 1 is a simplified schematic diagram illustrating a partial cross-sectional view of a quadruple junction photovoltaic cell that includes an active layer in a cell having a roughened back surface in accordance with embodiments of the present disclosure.

FIG. 1 illustrates a photoactive device 100 that may be formed using embodiments of methods of the present disclosure. The photoactive device 100 of FIG. 1 comprises a photovoltaic cell (e.g., a solar cell) that is configured to generate a voltage responsive to absorption of electromagnetic radiation (e.g., sunlight) impinging on the photoactive device 100. In other words, the photoactive device 100 is configured to convert electromagnetic radiation 102 (e.g., light) that impinges on the photoactive device 100 into electricity. The photoactive device 100 of FIG. 1 is a multi-junction photoactive device 100, and includes an active region 103 comprising a first active layer 104, a second active layer 106, a third active layer 108, and a fourth active layer 110. Each of the active layers 104, 106, 108, 110 defines a subcell of the multi junction photoactive device 100, and comprises sublayers. Each of the active layers 104, 106, 108, 110 (and the sublayers therein) comprises semiconductor material (e.g., germanium, silicon, a III-V semiconductor material, etc.).

Each of the active layers 104, 106, 108, 110 includes a pn junction defined between at least two sublayers therein. In other words, each of the active layers 104, 106, 108, 110 includes a sublayer comprising a p-type semiconductor material and an adjacent sublayer comprising an n-type semiconductor material, such that a pn junction is defined at the interface between the adjacent p-type and n-type semiconductor materials. As known in the art, a charge depletion region (also referred to in the art as a space charge layer) and an internal electric field is developed at the pn junction. As photons of the electromagnetic radiation 102 enter the photoactive device 100, they may be absorbed within the semiconductor materials in the active layers 104, 106, 108, 110. When a photon has an energy corresponding to the bandgap energy of the respective semiconductor material in which the photon is absorbed, an electron-hole pair may be generated within the semiconductor material. When photons are absorbed in the charge depletion regions at the pn junctions and result in the formation of electron hole pairs therein, the internal electric field at the pn junction drives the electron toward the n type region and the hole in the opposite direction toward the p type region. As electrons accumulate in the n type region and holes accumulate in the p type region, a voltage is generated across the pn junction. The voltages of the active layers 104, 106, 108, 110 are accumulated (e.g., in series) across the entire photoactive device 100 to provide an open circuit voltage $V_{oc}$ between a first electrode 111 on one side of the photoactive device 100 and a second electrode 112 on an opposing side of the photoactive device 100. The first electrode 111 and the second electrode 112 may comprise conductive metals or metal alloys. The second electrode 112 may be discontinuous so as to provide at least one aperture 114 through the second electrode 112 through which the electromagnetic radiation 102 may pass and enter the active layers 104, 106, 108, 110. An antireflective (AR) coating 115 may be provided on the photoactive device 100 in the aperture 114, as shown in FIG. 1.

Each of the active layers 104, 106, 108, 110 may be configured to absorb electromagnetic radiation 102 primarily at different wavelengths by employing semiconductor materials at the pn junction that have different compositions and bandgap energies.

The first active layer 104 may comprise a semiconductor material exhibiting a bandgap of between about 0.60 eV and about 2.10 eV, between about 0.60 eV and about 1.20 eV, or even between about 0.60 eV and about 0.80 eV. Additionally, the active layer 104 has a front surface 105A through which radiation 102 enters the active layer 104 during operation of the photoactive device 100 and a back surface 105B on an opposing side of the active layer 104 from the front surface 105A. The back surface 105B may have a surface roughness greater than a surface roughness of the front surface 105A.

By way of example and not limitation, the first active layer 104 may comprise germanium (Ge), and may have a bandgap energy of approximately 0.66 eV. For example, the first active layer 104 may be at least substantially comprised of monocrystalline epitaxial germanium. In other embodiments, the first active layer 104 may comprise a dilute nitride III-V semiconductor material, as described in, for example, U.S. Provisional Patent Application Ser. No. 61/580,085, filed Dec. 23, 2011 and titled "Methods of Forming Dilute Nitride Materials for Use in Photoactive Devices and Related Structures," the disclosure of which is incorporated herein in its entirety by this reference. As a non-limiting example, the first active layer 104 may comprise $Ga_{1-y}In_yN_xAs_{1-x}$, wherein y is greater than 0.0 and less than 1.0 (e.g., between about 0.08 and about 1), and x is between about 0.1 and about 0.5. The bandgap energy of the $Ga_{1-y}In_yN_xAs_{1-x}$ is a function of the composition thereof (i.e., the values of x and y). Thus, depending upon the values of x and y, the $Ga_{1-y}In_yN_xAs_{1-x}$ may exhibit a bandgap energy of between about 0.90 eV and about 1.20 eV. The $Ga_{1-y}In_yN_xAs_{1-x}$ may exhibit a bandgap energy of between about 1.00 eV and about 1.10 eV. Other dilute nitride materials, such as GaInNAsSb may be employed in the first active layer 104 in additional embodiments of the disclosure.

By way of example and not limitation, each of the second active layer 106, the third active layer 108, and the fourth active layer 110 may comprise a III-V semiconductor material. As non-limiting examples, the second active layer 106 may comprise a pn junction formed in InGaAsN III-V semiconductor material (a dilute nitride material, which may be as previously described herein in relation to the first active layer 104) having a bandgap energy of approximately 1.00 eV, the third active layer 108 may comprise a pn junction formed in GaAs III-V semiconductor material having a bandgap energy ranging between about 1.4 eV and about 1.5 eV (e.g., approximately 1.43 eV), and the fourth active layer 110 may comprise a pn junction formed in InGaP having a bandgap energy ranging between about 1.85 eV and about 2.10 eV (e.g., approximately 1.88 eV).

With continued reference to FIG. 1, each of the active layers 104, 106, 108, 110 may include additional layers of material, which may include, for example, window layers 116 and back surface field (BSF) layers 118. The window layers 116 and BSF layers 118 are used to transition the material composition across the photoactive device 100 in a manner that increases (e.g., maximizes) the collection of minority carriers that are generated in active layers.

As shown in FIG. 1, tunnel junction layers 120 may be disposed between the active layers 104, 106, 108, 110. The tunnel junction layers 120 are used to provide an interconnection having low electrical resistance between the opposing n and p type regions of the subcells adjacent the tunnel junction layers 120 on opposing sides thereof. The tunnel junction layers 120 may be at least substantially transparent to the electromagnetic radiation 102 to allow the electromagnetic radiation 102 to penetrate through the tunnel junction layers 120 to underlying subcells. Each tunnel junction layer 120 may comprise a highly doped n type layer and a highly doped p type layer (not shown). The semiconductor material or materials of the highly doped n and p type layers may have a wide band gap. In this configuration, the depletion region may be relatively narrow, and tunneling of electrons from the conduction band in the n type region to the valence band in the p type region is facilitated. Thus, the tunnel junction layers 120 may comprise a plurality of layers of semiconductor material (e.g., III-V semiconductor material) although they are schematically illustrated in a simplified manner as a single layer in FIG. 1.

Photoactive devices having less or more active layers (e.g., one, two, three, five, etc.) also may be fabricated in accordance with embodiments of the present disclosure.

The active layers 104, 106, 108, 110 (including the sublayers therein) and the tunnel junction layers 120 may be fabricated one on top of another using epitaxial growth techniques, as described in further detail below with reference to FIGS. 5 through 16.

In addition to the optical and electrical properties that are to be exhibited by the various layers of material in the photoactive device 100, the various semiconductor materials therein are crystalline (and often consist essentially of a single crystal of the material) and may be subject to physical constraints and considerations. The presence of defects in the crystalline structure of the various semiconductor materials can provide locations at which electrons and holes collect and recombine, thereby reducing the efficiency of the photoactive device 100. As a result, it is desirable to form the various semiconductor materials to have relatively low defect concentrations therein. To reduce the concentration of defects at the interfaces between the various semiconductor materials, the compositions of the various layers may be selected such that adjacent layers of material have generally matching lattice constants. These additional design parameters provide further restrictions on the materials that may be successfully employed in the various semiconductor materials within the photoactive device 100. Pseudomorphic layers (layers having different lattice constants, but sufficiently thin layer thicknesses to avoid strain relaxation) may be used.

As previously mentioned, the back surface 105B of the first active layer 104 may have a surface roughness that is greater than a surface roughness of the front surface 105A of the active layer 104. The back surface 105B may have a topography configured to reflect the electromagnetic radiation 102 impinging on the back surface 105B from within the first active layer 104. The increased surface roughness of the back surface 105B of the first active layer 104 may be used to increase the optical path of photons of the electromagnetic radiation 102 within the active layer 104 without increasing its actual physical thickness, so as to increase the probability that the photons will be absorbed and result in the generation of an electron-hole pair.

Figure 2:
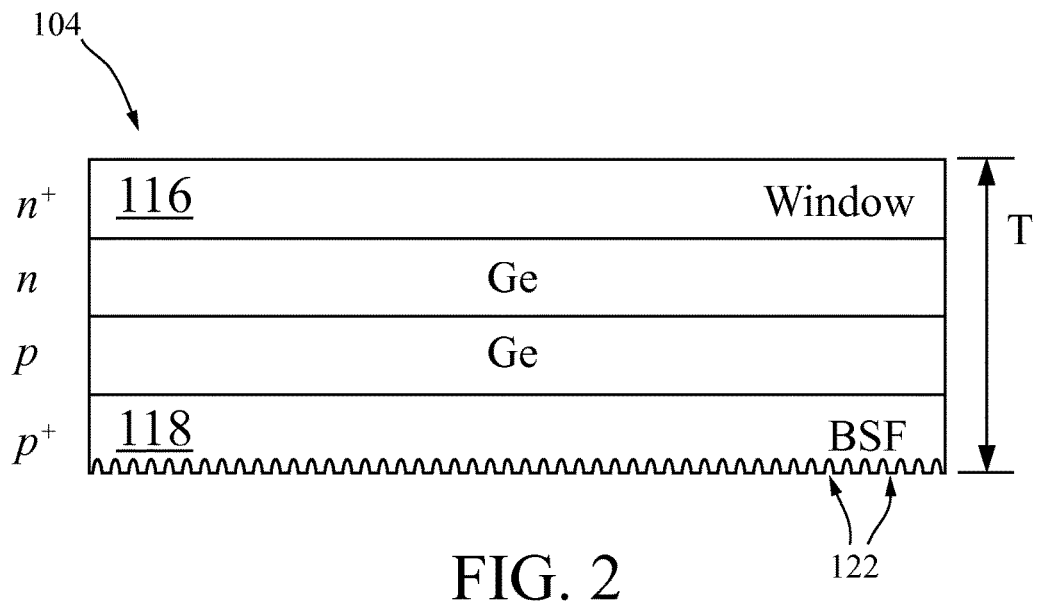
FIG. 2 is an enlarged view of a portion of the quadruple junction photovoltaic cell of FIG. 1, and illustrates the active layer having the roughened back surface.

FIG. 2 is an enlarged view of the first active layer 104 of the photoactive device 100 shown in FIG. 1. As shown in FIG. 2, the first active layer 104 may have an actual average layer thickness T. The first active layer 104 may have a composition selected such that electrons generated within the first active layer 104 responsive to absorption of photons of electromagnetic radiation 102 exhibit an average diffusion length greater than the actual average layer thickness T of the first active layer 104. In some embodiments, the average layer thickness T of the first active layer 104 may be about one hundred microns (100 μm) or less, or even about ten microns (10 μm) or less. The n-Ge layer shown in FIG. 2 may have an average layer thickness of about one micron (1 μm) or less, and the p-Ge layer shown in FIG. 1 may have an average layer of about ten microns (10 μm) or less. Due, however, to the fact that the photons may be reflected from the back surface 105B such that they remain within the first active layer 104 for a relatively longer amount of time, the probability that the photons are absorbed within the first active layer 104 may be increased relatively to previously known active layers of equivalent composition and thickness T, but without a roughened back surface 105B.

The topography of the back surface 105B of the first active layer 104 may include a plurality of texture features 122. The texture features 122 may comprise one or both of protrusions extending out from the back surface 105B and recesses extending into the back surface 105B. The texture features 122 may be randomly located and dispersed across the back surface 105B, or they may be located at selected locations across the back surface 105B. In some embodiments, the texture features 122 may be disposed in an ordered array, each texture feature 122 located at a predetermined and selected location, across the back surface 105B of the active layer 104.

Figure 3:
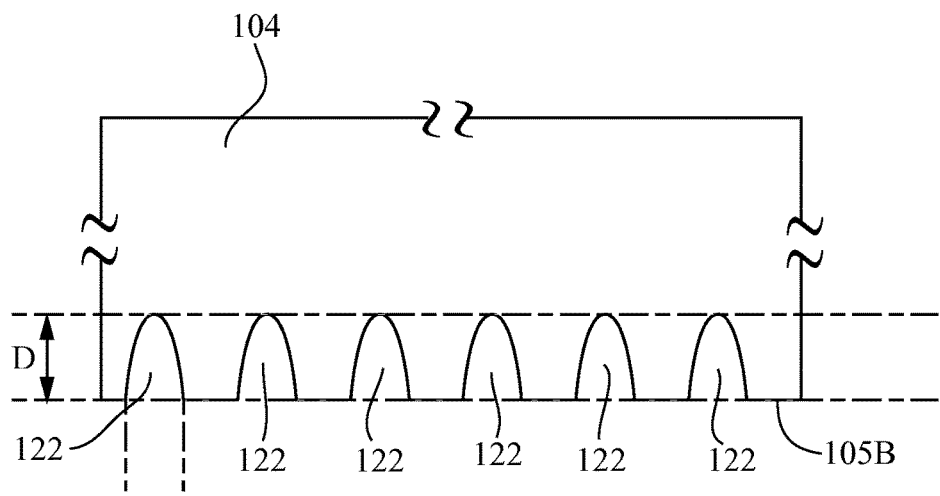
FIG. 3 is an enlarged view of a portion of FIG. 2 illustrating the roughened back surface of the active layer.

FIG. 3 is an enlarged view of a portion of the back surface 105B of the active layer 104 of FIGS. 1 and 2. As shown in FIG. 3, the texture features 122 may comprise recesses that extend into the active layer 104 from the back surface 105B of the active layer 104. The recesses may comprise discrete blind holes laterally isolated from one another that extend into the back surface 105B. The recesses may have any cross-sectional shape such as circular, oval, square, rectangular, etc. In other embodiments, the recesses may comprise elongated channels or grooves in the back surface 105B, and may be elongated in directions within the plane of the back surface 105B.

Figure 4:
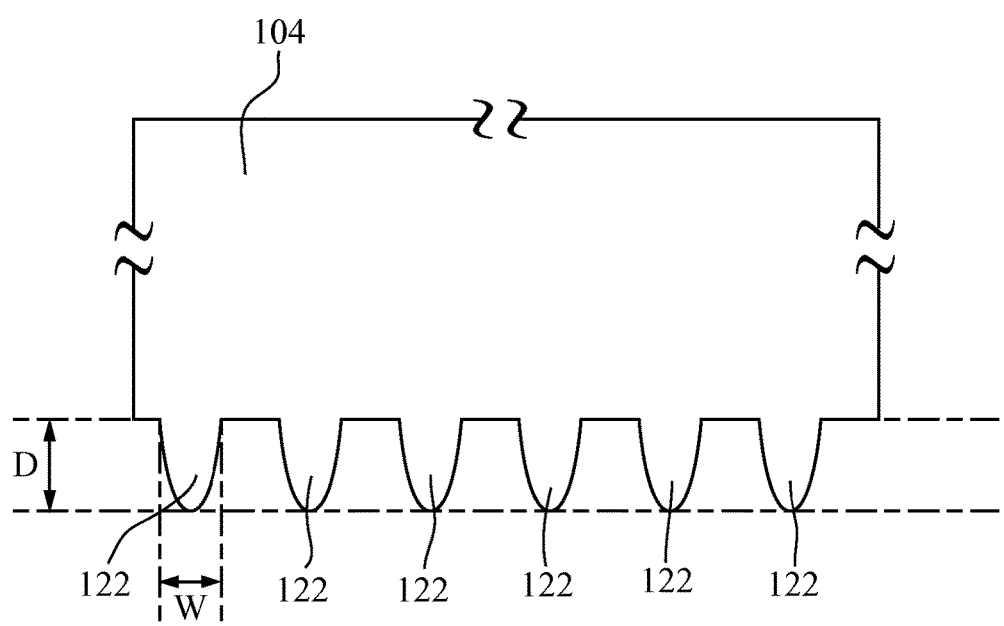
FIG. 4 illustrates another roughened back surface of an active layer that may be employed in additional embodiments of the present disclosure.

In additional embodiments, the texture features 122 may comprise protrusions that extend out from the active layer 104 from the back surface 105B thereof, as shown in FIG. 4. The protrusions may comprise discrete laterally isolated mounds or columns that are laterally isolated from one another. The protrusions may have any cross-sectional shape such as circular, oval, square, rectangular, etc. In other embodiments, the protrusions may comprise elongated ridges that project out from the back surface 105B, and may be elongated in directions within the plane of the back surface 105B.

As shown in FIGS. 3 and 4, in some embodiments, the plurality of texture features 122 may have an average cross-sectional dimension D in a plane perpendicular to the to the active layer 104 that is between about ten nanometers (10 nm) and about ten microns (10 μm), and more particularly, between about ten nanometers (10 nm) and about five microns (5 μm), or even between about ten nanometers (10 nm) and about one micron (1 μm). For example, referring to FIG. 3, the recesses may extend an average distance D into the active layer 104 from the back surface 105B that is between about ten nanometers (10 nm) and about ten microns (10 μm). As shown in FIG. 4, the projections may extend an average distance D out from the active layer 104 from the back surface 105B that is between about ten nanometers (10 nm) and about ten microns (10 μm).

As shown in FIGS. 3 and 4, in some embodiments, the plurality of texture features 122 may have an average cross-sectional dimension W in a plane parallel to the to the active layer 104 that is between about one hundred nanometers (100 nm) and about fifty microns (50 μm), between about one hundred nanometers (100 nm) and about twenty microns (20 μm), or even between about one hundred nanometers (100 nm) and about ten microns (10 μm). For example, referring to FIG. 3, the recesses may have an average width W that is between about one hundred nanometers (100 nm) and about fifty microns (50 μm). As shown in FIG. 4, the projections may have an average width W that is between about one hundred nanometers (100 nm) and about fifty microns (50 μm).

The average cross-sectional dimensions D and W of the texture features 122 may be selected to maximize the probability that radiation 102 (FIG. 1) having wavelengths in the range extending from about 1,550 nm to about 1,800 nm will be reflected from the back surface 105B and back into the active layer 104 during operation of the photoactive device 100, so as to increase the probability that the photons of the radiation 102 will be absorbed within the active layer 104 and result in generation of an electron-hole pair.

As previously mentioned, the first active layer 104 may include p-type doped sublayers and n-type doped sublayers, between which a pn junction is defined. Thus, a region of the active layer 104 includes at least one p-type dopant, and another region of the active layer 104 includes at least one n-type dopant. In some embodiments, a concentration of the one or more p-type dopants within the p-type region of the active layer 104 may exhibit a concentration gradient across the p-type region of the active layer 104. For example, a concentration of the one or more p-type dopants within the p-type region of the active layer 104 may decrease in a direction extending from the back surface 105B of the active layer 104 toward the front surface 105A of the active layer 104. By providing such a concentration gradient in the p-type region of the active layer 104, an electric field may be provided therein that assists in urging movement of electrons toward the n side of the active layer 104 (i.e., toward the front surface 105A of the active layer 104 in the embodiment shown in FIGS. 1 through 4). In some embodiments, the concentration of the one or more p-type dopants within the p-type region of the active layer 104 may decrease exponentially in the direction extending from the back surface 105B of the active layer 104 toward the front surface 105A of the active layer 104, such that an at least substantially constant electric field is provided within the p-type region of the active layer 104.

Additional embodiments of the present disclosure include methods of fabricating photoactive devices as described herein. In general, the methods include formation of an active region 103 that is configured to absorb radiation 102 impinging on the active region 103 and to generate a voltage between a first electrode 111 and a second electrode 112 responsive to absorption of the radiation 102. The active region 103 may be formed to include at least one active layer, such as the active layer 104, that comprises a semiconductor material exhibiting a bandgap of between about 0.60 eV and about 2.10 eV. The active layer 104 may be formed to include a front surface 105A through which radiation 102 enters the active layer 104 during operation of the photoactive device 100, and a back surface 105B on an opposing side of the active layer 104 from the front surface 105A. The back surface 105B may be formed to have a surface roughness greater than a surface roughness of the front surface 105A. The methods may further include formation of the first electrode 111 and the second electrode 112 between which a voltage is generated responsive to absorption of radiation 102 impinging on the active region 103. Non-limiting examples of embodiments of such methods are disclosed below with reference to FIGS. 5 through 16.

Figure 8:
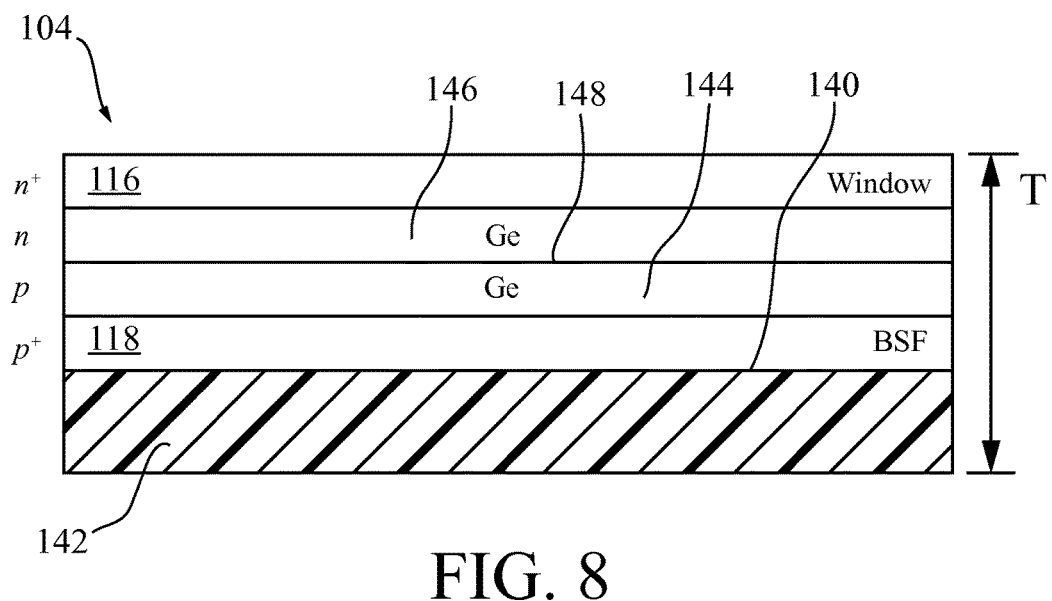

Referring briefly to FIG. 8, an active layer 104 may be formed on a surface 140 of a first substrate 142, such that a back surface 105B of the active layer 104 is disposed adjacent the surface 140 of the first substrate 142.

The composition of the first substrate 142 may be selected in consideration of several factors that depend on the composition of layers to be formed or otherwise provided over the first substrate 142. For example, the composition of the substrate may be selected to comprise a crystalline material having a crystal structure that is generally similar to a crystal structure of materials to be formed or otherwise provided over the first substrate 142. The composition of the substrate also may be selected to comprise a material coefficient of thermal expansion that is generally similar to coefficients of thermal expansion that will be exhibited by materials to be formed or otherwise provided over the first substrate 142. By selecting the first substrate 142 to have a crystal structure and coefficient of thermal expansion generally similar to those of materials to be formed or otherwise provided over the first substrate 142, mechanical strain within the materials may be reduced during subsequent processing, and, as a result, undesirable defects within the crystal lattices of the materials to be formed or otherwise provided over the first substrate 142 may be reduced. As non-limiting examples, in embodiments in which germanium (Ge) is to be formed or otherwise provided directly over the first substrate 142, the first substrate 142 may comprise, for example, an oxide such as aluminum oxide ($Al_2O_3$) (e.g., a sapphire substrate) or silicon oxide ($SiO_2$).

As previously discussed with reference to FIG. 1, the active layer 104 may define a subcell of a multi junction photoactive device 100 (FIG. 1) to be formed, and may comprise multiple sublayers. The active layer 104 may be formed to include a pn junction between two sublayers in the active layer 104. In other words, the active layer 104 may include a sublayer 144 comprising a p-type semiconductor material and an adjacent sublayer 146 comprising an n-type semiconductor material, such that a pn junction 148 is defined at the interface between the adjacent p-type and n-type semiconductor materials. As previously discussed, the active layer 104 may comprise a semiconductor material exhibiting a bandgap of between about 0.60 eV and about 2.10 eV. By way of example and not limitation, the active layer 104 may comprise germanium (Ge) (e.g., monocrystalline epitaxial Ge), and may have a bandgap energy of approximately 0.66 eV. In other embodiments, the active layer 104 may comprise a dilute nitride III-V semiconductor material, as previously discussed herein. The active layer may include additional sublayers of material, which may include, for example, a window layer 116 and a back surface field (BSF) layer 118 as previously described with reference to FIG. 1.

In some embodiments, to form the first layer 104 over the surface 140 of the first substrate 142, a first layer of material 150 (FIG. 7) comprising the semiconductor material of the first layer 104 may be transferred to the surface 140 of the first substrate 142, after which the transferred first layer of material 150 may be thickened to form the active layer 104, as described with reference to FIGS. 5 through 8 below.

By way of example and not limitation, the process known in the art as the SMART-CUT® process may be used to transfer a first layer of material 150 (FIG. 7) from a donor structure 152 (FIG. 5) onto the first substrate 142. The SMART-CUT® process is described in, for example, U.S. Pat. No. RE39,484 to Bruel (issued Feb. 6, 2007), U.S. Pat. No. 6,303,468 to Aspar et al. (issued Oct. 16, 2001), U.S. Pat. No. 6,335,258 to Aspar et al. (issued Jan. 1, 2002), U.S. Pat. No. 6,756,286 to Moriceau et al. (issued Jun. 29, 2004), U.S. Pat. No. 6,809,044 to Aspar et al. (issued Oct. 26, 2004), and U.S. Pat. No. 6,946,365 to Aspar et al. (Sep. 20, 2005), the disclosures of which are incorporated herein in their entireties by this reference.

Figure 5:
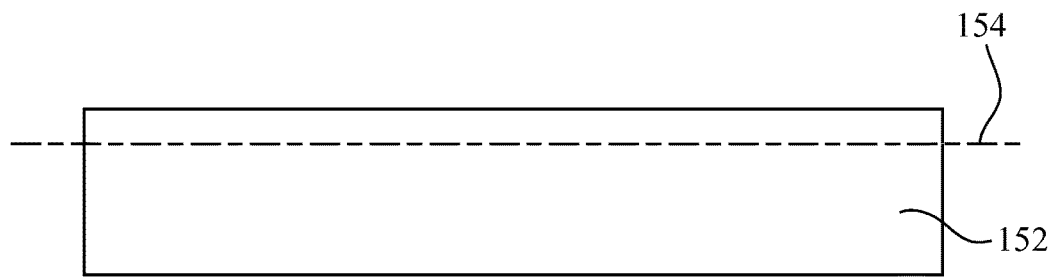
FIGS. 5 through 16 are simplified cross-sectional side views of structures schematically illustrating embodiments of methods of the present disclosure that may be used to fabricate photoactive devices as described herein.

The SMART-CUT® process is briefly described below with reference to FIGS. 5 through 7. Referring to FIG. 5, a plurality of ions (e.g., one or more of hydrogen, helium, or inert gas ions) may be implanted into a donor structure 152 along an ion implant plane 154. The donor structure 152 may comprise a bulk crystalline semiconductor material, such as monocrystalline germanium. The implanted ions along the ion implant plane 154 define a weakened ion implant plane within the donor structure 152, along which the donor structure 152 subsequently may be cleaved or otherwise fractured. As known in the art, the depth at which the ions are implanted into the donor structure 152 is at least partially a function of the energy with which the ions are implanted into the donor structure 152. Generally, ions implanted with less energy will be implanted at relatively shallower depths, while ions implanted with higher energy will be implanted at relatively deeper depths.

Figure 6:
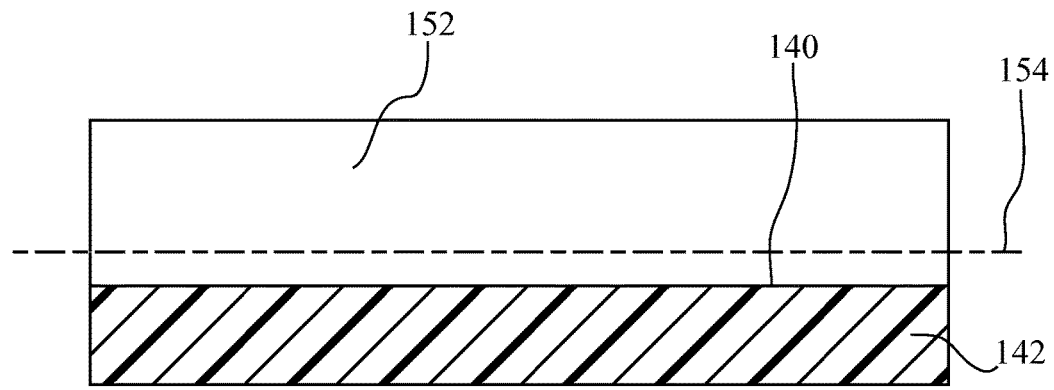

Referring to FIG. 6, the donor structure 152 is brought into direct physical contact with the surface 140 of the first substrate 142, and the donor structure 152 is bonded directly to the first substrate 142 using a so-called "direct bonding" process. Prior to abutting the surfaces of the donor structure 152 and the first substrate 142 together, the surfaces may be smoothened and prepared for bonding by, for example, subjecting the surfaces to one or more of a grinding process, an etching process, and a polishing process (e.g., a chemical-mechanical polishing (CMP) process) to reduce a surface roughness of the bonding surfaces. The surfaces of the donor structure 152 and the first substrate 142 also may be chemically activated prior to abutting the surfaces together for bonding so as to enhance the strength of the bonds ultimately established therebetween.

After abutting the surfaces of the donor structure 152 and the first substrate 142 together, direct atomic bonds may be established between the donor structure 152 and the first substrate 142 to form the bonded structure shown in FIG. 6. Methods for establishing such direct atomic bonds are described in, for example, U.S. Patent Application Publication No. US 2011/0045611 A1, which published Feb. 24, 2011 in the name of Castex et al., the disclosure of which is incorporated herein in its entirety by this reference.

Optionally, a layer of dielectric material may be provided on a bonding surface of the donor structure 152 and/or the surface 140 of the first substrate 142 prior to the direct bonding process.

Figure 7:
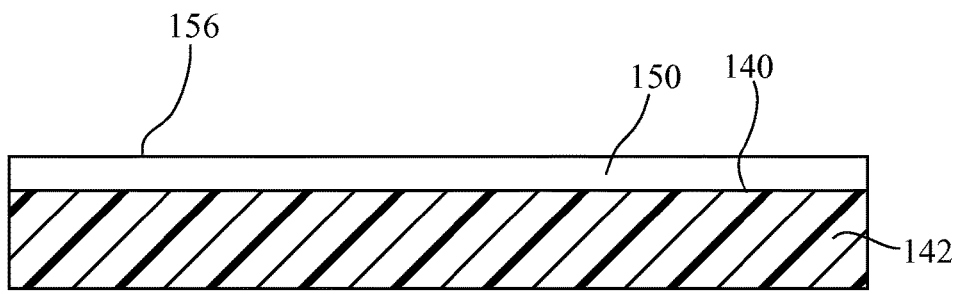

After forming the bonded structure of FIG. 6, the donor structure 152 is cleaved or otherwise fractured along the ion implant plane 154 to complete transfer of the layer of material 150 to the surface 140 of the first substrate 142 and form the structure of FIG. 7. For example, the donor structure 152 (with the first substrate 142 bonded thereto) may be heated to cause the donor structure 152 to fracture along the ion implant plane 154. Optionally, mechanical forces may be applied to the donor structure 152 to assist in the cleaving of the donor structure 152 along the ion implant plane 154. After the donor structure 152 has been cleaved or otherwise fractured along the ion implant plane 154, a portion of the donor structure 152 remains bonded to the first substrate 142, which portion defines the transferred layer of material 150 (FIG. 7). A remainder of the donor structure 152 may be reused in further SMART-CUT® processes to transfer additional portions of the donor structure 152 to additional substrates.

With continued reference to FIG. 7, after the fracturing process, an exposed major surface 156 of the transferred layer of material 150 comprises a fractured surface of the donor structure 152 (FIG. 6), and may include ion impurities and imperfections in the crystal lattice of the layer of material 150. The layer of material 150 may be treated in an effort to reduce impurity levels and improve the quality of the crystal lattice (i.e., reduce the number of defects in the crystal lattice proximate the exposed major surface 156) in the layer of material 150. Such treatments may involve one or more of grinding, polishing, etching, and thermal annealing.

In other embodiments, the layer of material 150 may be provided on the surface 140 of the first substrate 142 by bonding bulk semiconductor material to the surface 140 of the first substrate 142 and subsequently thinning the bulk semiconductor material using one or more of a grinding process, a polishing process, and an etching process (e.g., a chemical-mechanical polishing process) to form the layer of material 150.

In further embodiments of the present disclosure, the layer of material 150 may comprise a freestanding material, wherein the layer of material is self supporting without the need for support, such as support from the first substrate 142. In such embodiments, the layer of material 150 may be formed by implanting high energy ions into a bulk donor structure 152. The utilization of a high dose ion implantation may provide a freestanding layer of material 150 having an average layer thickness in the range extending from about 10 micrometers to about 50 micrometers (e.g., an average layer thickness equal to about twenty micrometers (20 μm)).

In some embodiments, the transferred layer of material 150 may have an average layer thickness that is about 1.50 μm or less.

Referring again to FIG. 8, after forming the relatively thin layer of material 150 on the surface 140 of the first substrate 142, the thin layer of material 150 may be thickened by, for example, epitaxially growing an additional layer of material on the relatively thin layer of material 150 to form the active layer 104. For example, as shown in FIG. 8, additional semiconductor material, which may be of the same or similar composition to the semiconductor material of the layer of material 150, may be epitaxially grown on the layer 150 to complete formation of the active layer 104. As a particular non-limiting example, the epitaxial growth may involve the formation of a heavily doped p-type Ge BSF layer 118, a doped p-type Ge sublayer 144, a doped n-type Ge sublayer 146 so as to define a pn junction 148, and a heavily doped n-type Ge window layer 116. Other embodiments may not include a BSF layer 118 and/or a window layer 116. Various epitaxial growth techniques that may be used to grow such doped layers of Ge are known in the art and may be employed in embodiments of the present disclosure. Such growth techniques include, but are not limited to, chemical vapor deposition (CVD) techniques, metalorganic chemical vapor deposition (MOCVD) techniques, vapor phase epitaxy (VPE) techniques, physical vapor deposition (PVD) techniques, and molecular beam epitaxy (MBE) techniques. Additionally, various configurations of such Ge-based active layers 104 used as subcells for multi junction photoactive devices are known in the art and may be employed in embodiments of the present disclosure.

As previously mentioned, the first active layer 104 may be formed to include p-type doped sublayers and n-type doped sublayers, between which a pn junction is defined. Thus, p-type dopants may be introduced into the region of the active layer 104 to be doped p-type during fabrication of the p-type region of the active layer 104, and n-type dopants may be introduced into the region of the active layer 104 to be doped n-type during fabrication of the n-type region of the active layer 104. Further, a concentration of the one or more p-type dopants may be varied during fabrication of the p-type region, such that a concentration gradient is provided across a thickness of the p-type region of the active layer 104 upon formation thereof. For example, a concentration of the one or more p-type dopants within the p-type region of the active layer 104 may be caused to decrease in a direction extending from the back surface 105B of the active layer 104 toward the front surface 105A of the active layer 104, as previously discussed. By providing such a concentration gradient in the p-type region of the active layer 104, an electric field may be provided therein that assists in urging movement of electrons toward the n side of the active layer 104 (i.e., toward the front surface 105A of the active layer 104 in the embodiment shown in FIG. 8).

As formed, in some embodiments, the back surface 105B of the active layer 104 may have a surface roughness that is at least substantially similar to a surface roughness of the front surface 105A of the active layer 104.

Figure 9:
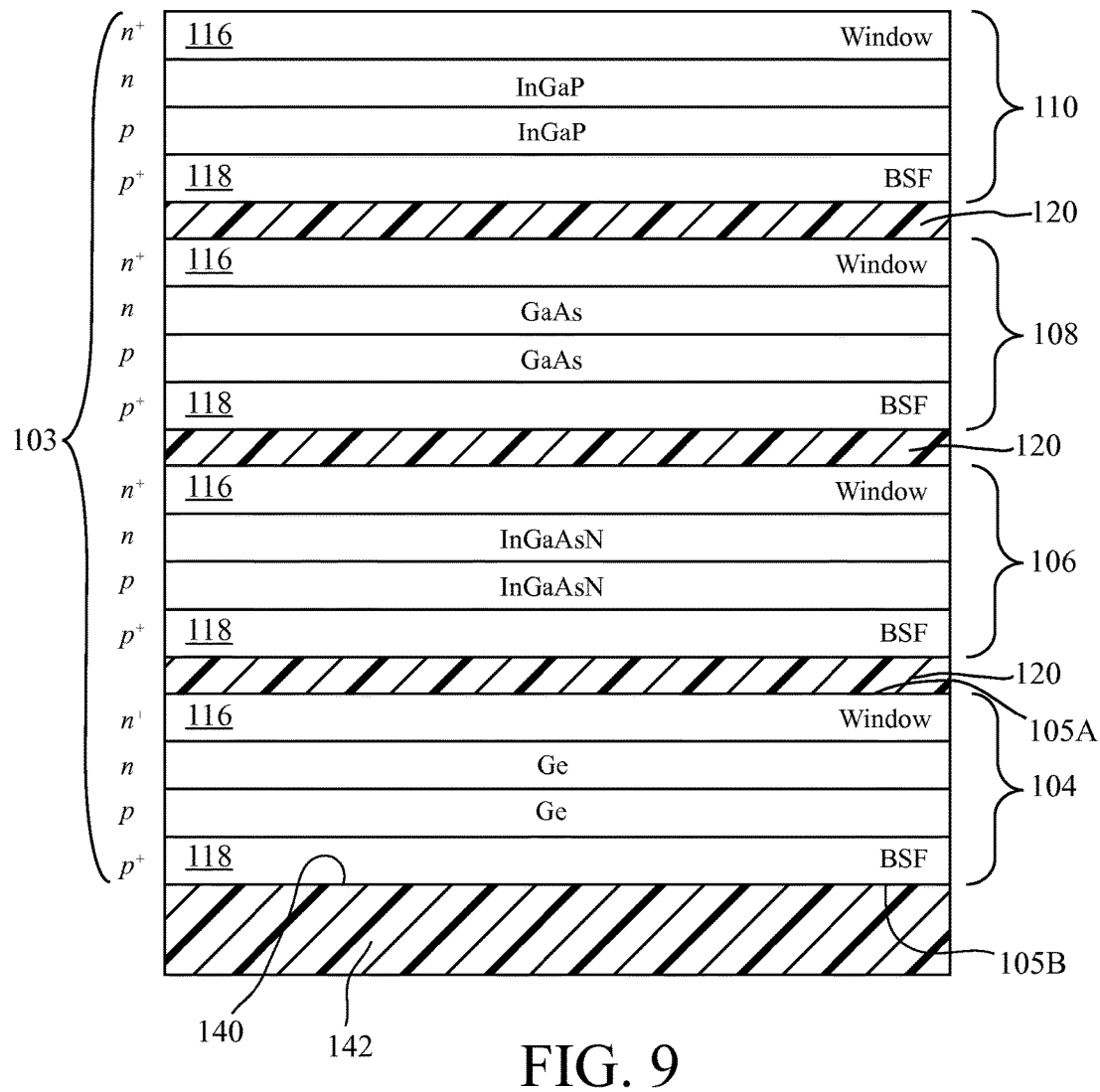

Referring to FIG. 9, after forming the active layer 104, additional layers of the photoactive device 100 (FIG. 1) optionally may be fabricated over the active layer 104. For example, formation of an active region 103 of the photoactive device 100 may be completed, and such an active region 103 may include one or more additional active layers defining additional subcells of the photoactive device 100. As a non-limiting example, a second active layer 106, a third active layer 108, and a fourth active layer 110 as previously described with reference to FIG. 1 may be fabricated over the first active layer 104. Tunnel junction layers 120 also may be formed between the adjacent active layers 104, 106, 108, 110.

The various additional layers may be fabricated by epitaxially growing the various layers one over another in a sequential manner. The particular growth technique employed for each layer or sublayer may depend on the composition of the respective layer or sublayer. Growth techniques commonly employed for epitaxial growth of such layers include chemical vapor deposition (CVD) techniques, metalorganic chemical vapor deposition (MOCVD) techniques, vapor phase epitaxy (VPE) techniques, metalorganic vapor phase epitaxy (MOVPE) techniques, physical vapor deposition (PVD) techniques, and molecular beam epitaxy (MBE) techniques.

Figure 10:
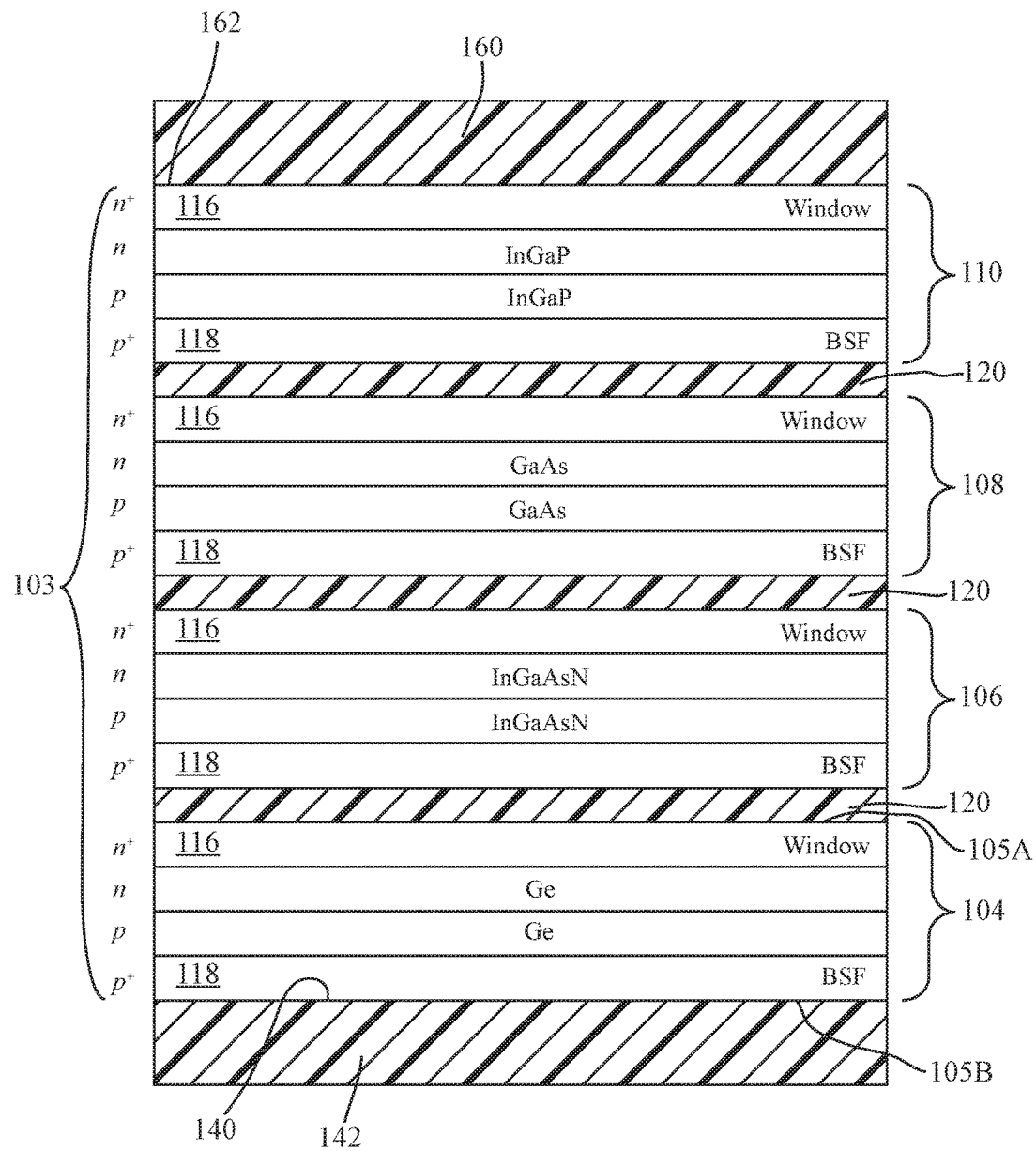

Referring to FIG. 10, a second substrate 160 may be attached over the active layer 104 (and over any additional layers previously fabricated over the active layer 104) on a side thereof opposite the first substrate 142 while the first substrate 142 remains attached to the first active layer 104.

The second substrate 160 may comprise any of a number of materials including oxides (e.g., aluminum oxide, zirconium oxide, silicon oxide, etc.) and semiconductor materials (e.g., silicon, germanium, silicon carbide, a III-V semiconductor material (e.g., GaAs, GaN, etc.), aluminum nitride, diamond etc.). The second substrate 160 may comprise a crystalline material (e.g., polycrystalline or monocrystalline material). Further, the second substrate 160 may be at least substantially comprised by a single, generally homogeneous material, or the second substrate 160 may comprise a multi-layer structure, such as a semiconductor-on-insulator (SeOI) type structure, such as a gallium arsenide-on-sapphire (GaAsOS) substrate or a germanium-on-sapphire (GeOS) substrate.

The second substrate 160 may be attached over the active layer 104 using, for example, a direct bonding process as previously described herein. In some embodiments, the second substrate 160 may be attached directly to an exposed major surface 162 of the active region 103 (which, in the embodiment of FIG. 10, comprises an exposed surface of a window layer 116 of the fourth active layer 110) in a direct bonding process.

Figure 11:
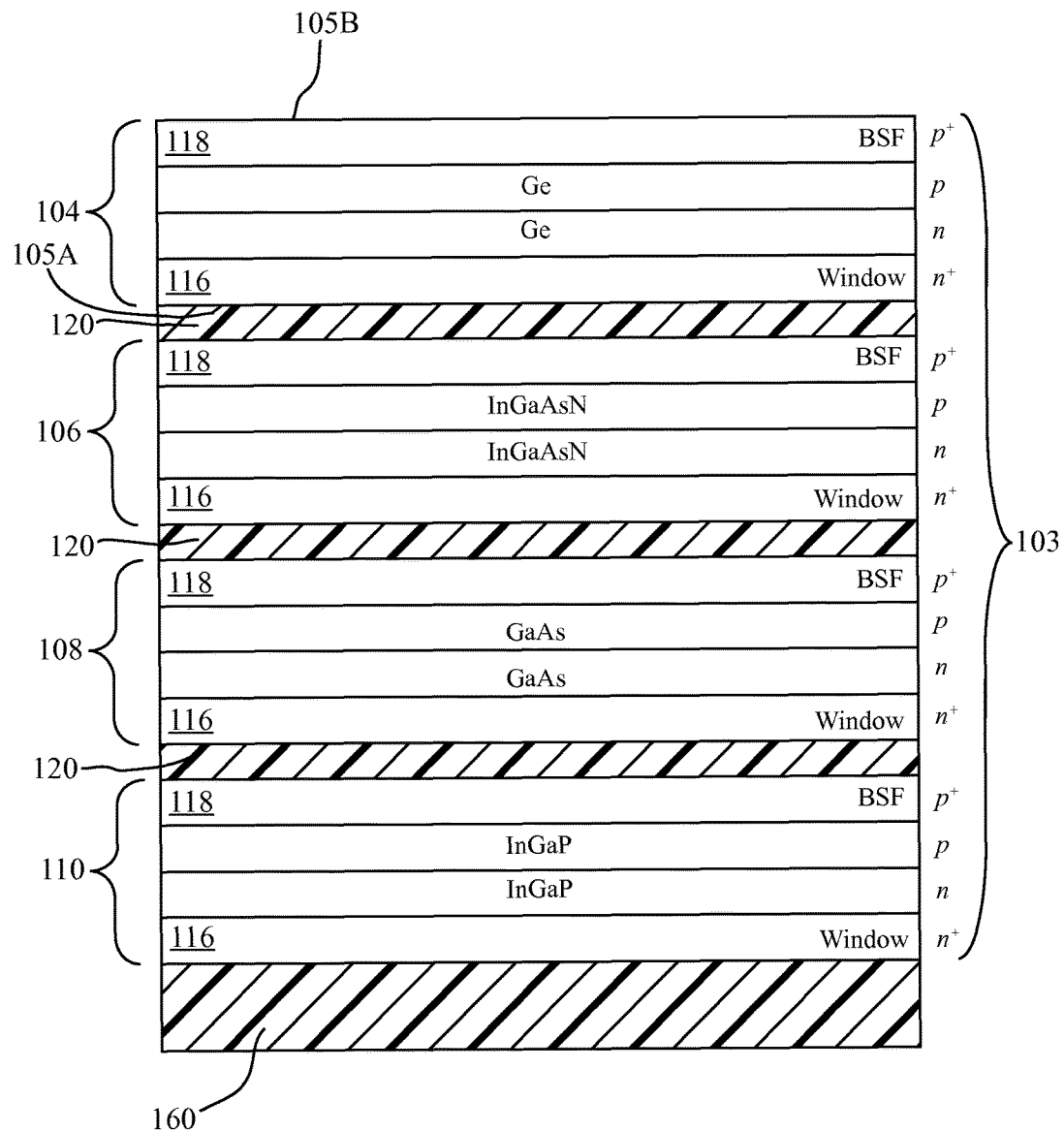

After attaching the second substrate 160 over the active layer 104, the first substrate 142 may be removed from the active layer 104 so as to expose the back surface 105B of the active layer 104, as shown in FIG. 11. The structure is illustrated in FIG. 11 in an orientation that is rotated 180° (i.e., inverted) relative to the orientation depicted in FIG. 10. The first substrate 142 may be removed from the active layer 104 using, for example, one or more of a grinding process, a polishing process, and a chemical (wet or dry) etching process (e.g., a chemical-mechanical polishing (CMP) process). As a non-limiting example, a majority of the first substrate 142 may be removed using a mechanical grinding process, after which a relatively thin remaining layer of the first substrate 142 may be removed by a chemical etching process with an etchant that is selective to a material of the first substrate 142 relative to the material of the active layer 104. The active layer 104 may serve as an etch stop layer for the etching process used to remove the first substrate 142.

Figure 12:
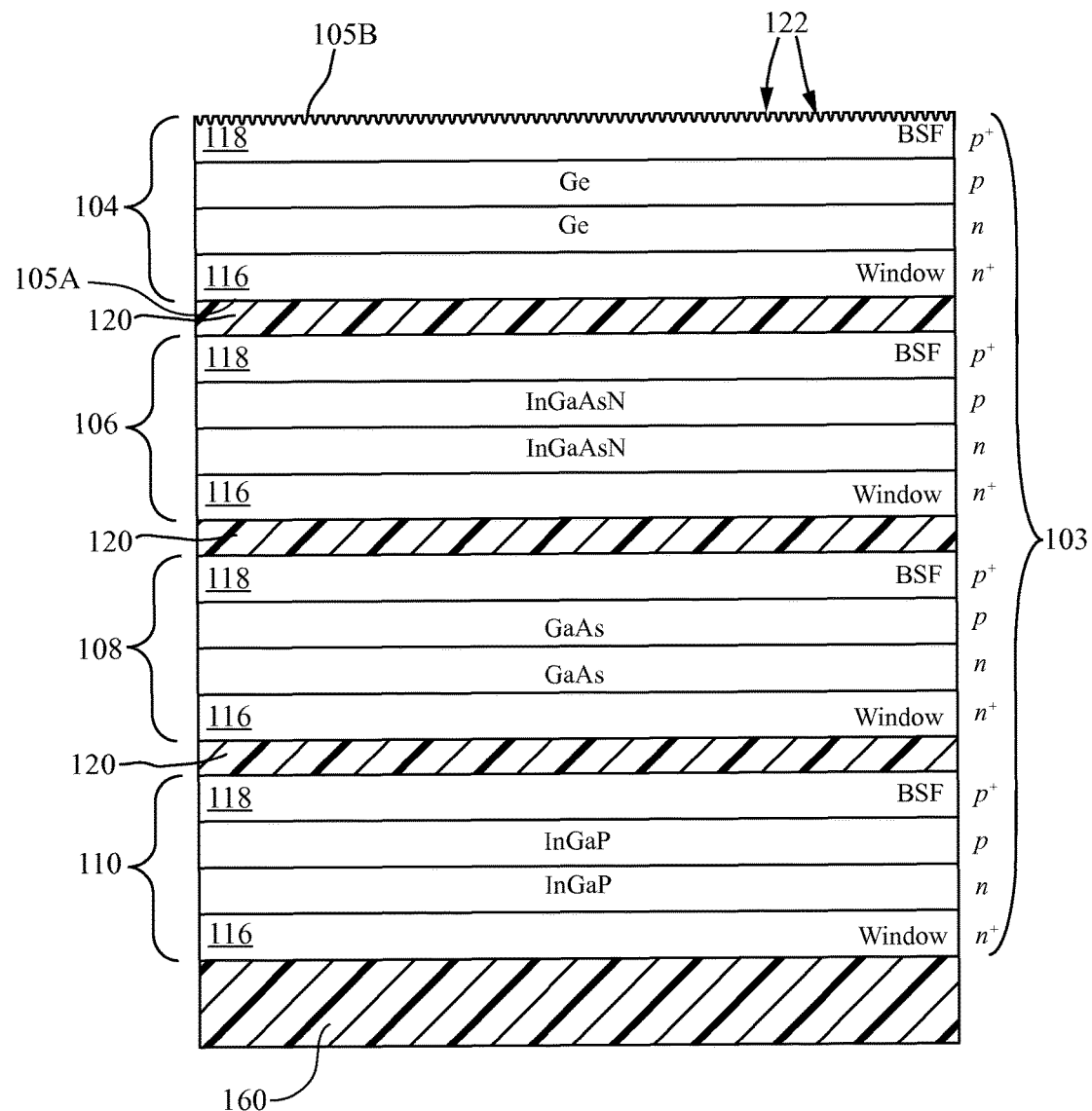

Referring to FIG. 12, after removing the first substrate 142, the exposed back surface 105B of the active layer 104 may be processed in a manner causing the back surface 105B to have a surface roughness that is greater than the surface roughness of the front surface 105A of the active layer 104. Stated another way, the exposed back surface 105B of the active layer 104 may be roughened after removing the first substrate 142 to increase a surface roughness of the back surface 105B. The roughening of the back surface 105B may form the texture features 122 (e.g., recesses and/or protrusion) and provide the resulting topography of the back surface 105B, as previously described with reference to FIGS. 1 through 4.

Various techniques may be used to roughen the back surface 105B and form the texture features 122. By way of example and not limitation, the back surface 105B may be processed by at least one of a chemical etching process and a mechanical roughening process to increase the surface roughness of the back surface 105B. In some embodiments, a grinding process may be used to roughen the back surface 105B and form texture features 122 comprising recesses and/or protrusions in the back surface 105B. In some embodiments, a chemical-mechanical polishing (CMP) process may be used to roughen the back surface 105B and form texture features 122 comprising recesses and/or protrusions in the back surface 105B. In other embodiments, a chemical etching process may be used to roughen the back surface 105B and form texture features 122 comprising recesses and/or protrusions in the back surface 105B. Such a chemical etching process may employ one or both of a wet chemical etchant and a dry plasma etchant.

In some embodiments, the back surface 105B may be roughened using a photolithographic masking and etching process. In such embodiments, a mask layer may be deposited over the exposed back surface 105B of the active layer 104 and selectively patterned so as to form apertures through the mask layer at the locations at which it is desired to etch into the back surface 105B so as to form apertures and/or protrusions. After forming the patterned mask layer, the regions of the active layer 104 that are exposed through the patterned mask layer may be etched using, for example, a wet etching process or a dry reactive ion etching process to remove regions of the active layer 104 in a manner selected to define recesses and/or protrusions at the back surface 105B. The shape of the recesses and/or protrusions defined at the back surface 105B of the active layer 104 may be at least partially a function of the shape of the apertures in the patterned mask layer and the type of etching process (e.g., isotropic or anisotropic) used to etch the active layer 104.

After the etching process, the patterned mask layer may be removed. Such a masking and etching process may be used to form recesses and/or protrusions at predetermined and selected locations on the back surface 105B of the active layer 104.

Figure 13:
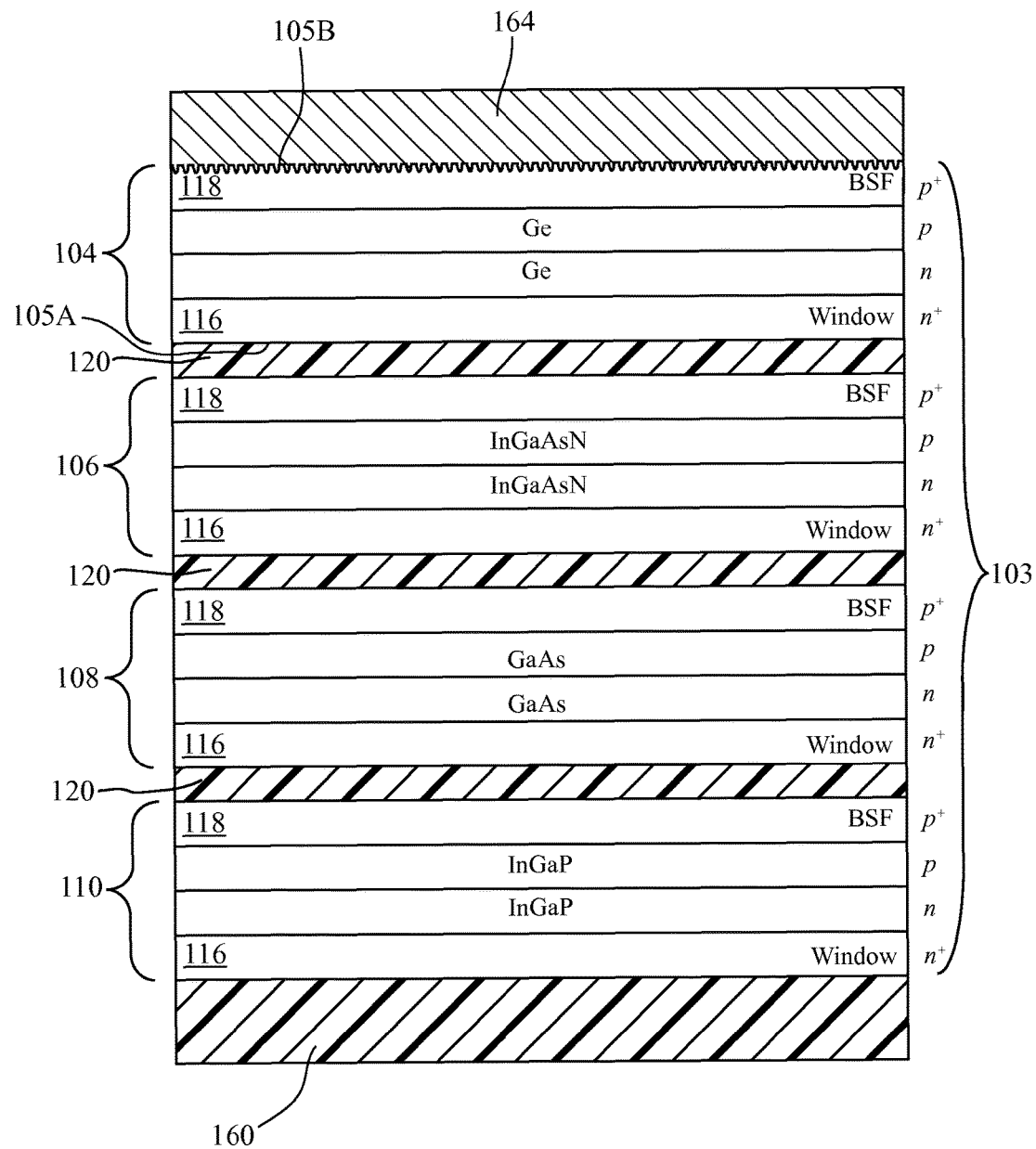

Referring briefly to FIG. 1, methods of the present disclosure may further include formation of the first electrode 111 and the second electrode 112 between which a voltage is generated responsive to absorption of radiation 102 impinging on the active region 103. Referring to FIG. 13, to form the first electrode 111, one or more conductive materials may be provided on the roughened back surface 105B of the active layer 104. For example, a conductive metal 164 may be deposited or otherwise provided on the roughened back surface 105B to provide an ohmic contact between the conductive metal 164 and the active layer 104. The conductive metal 164 may comprise, for example, tungsten (W), copper (Cu), tantalum (Ta), titanium (Ti), silver (Ag), molybdenum (Mo), or an alloy or mixture comprising one or more of such elements. In some embodiments, the conductive metal 164 may comprise a multi-layer stack of metals having different compositions. The conductive metal 164 may be deposited on the back surface 105B using one or more of a chemical vapor deposition (CVD) process, a physical vapor deposition (PVD) process, a sputtering process, an electroless plating deposition process, and an electrolytic plating deposition process.

Figure 14:
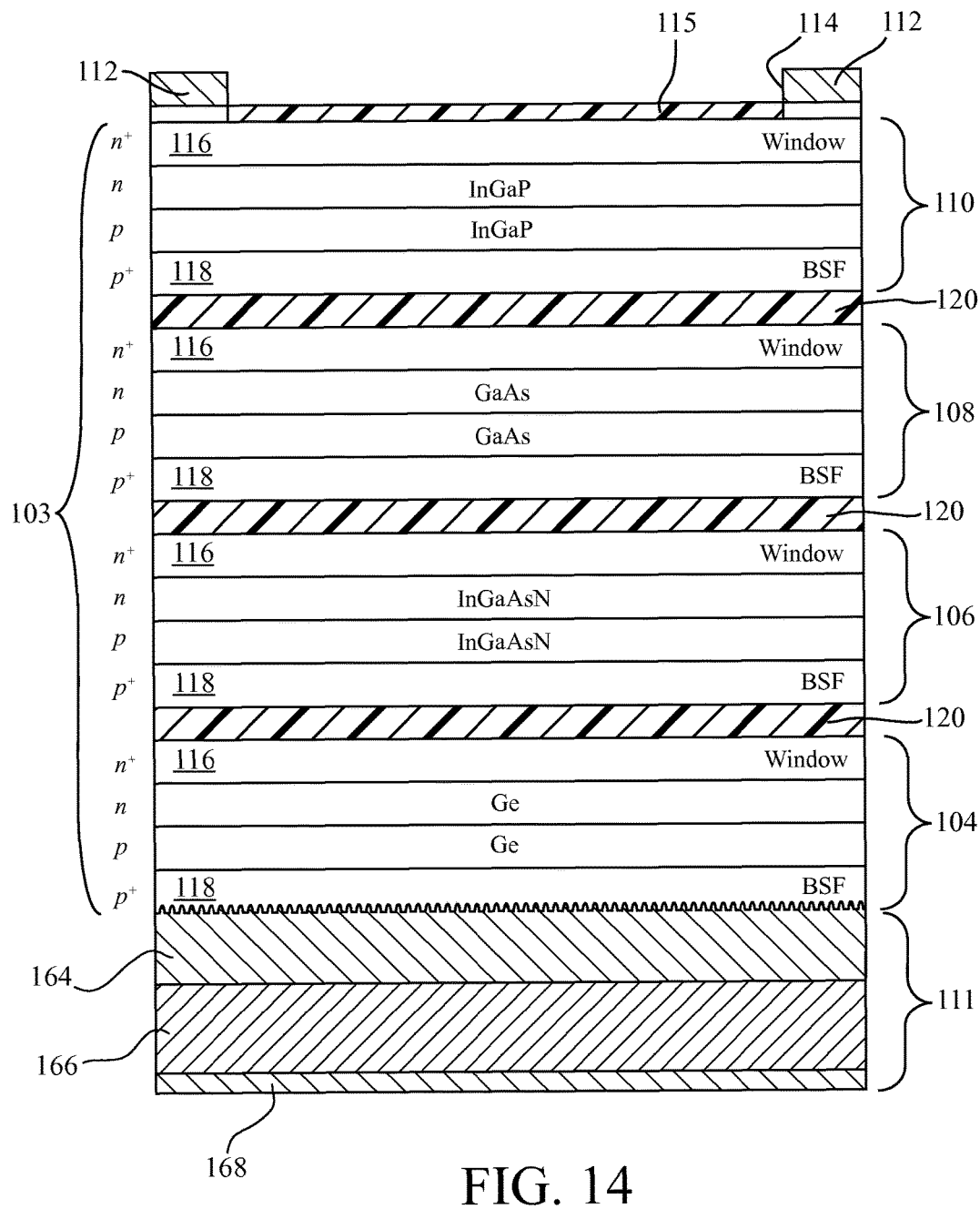

As shown in FIG. 14, fabrication of the first electrode 111 and the second electrode 112 may be completed. Optionally, a conductive substrate 166 (e.g., a handle substrate) may be bonded to the conductive metal 164 if, for example, the conductive metal 164 is not sufficiently thick to permit handling of the structure. The conductive substrate 166 may comprise, for example, a metal such as tungsten (W), copper (Cu), tantalum (Ta), titanium (Ti), silver (Ag), molybdenum (Mo), or an alloy or mixture comprising one or more of such elements. The conductive substrate 166 may be bonded to the conductive metal 164 using, for example, a direct bonding process as previously described herein. Optionally, an additional layer of contact metal 168 may be deposited over a surface of the conductive substrate 166 on a side thereof opposite the conductive metal 164. The conductive metal 164, conductive substrate 166, and contact metal 168 together may define the first electrode 111.

With continued reference to FIG. 14, the second substrate 160 (FIG. 13) may be removed, and the second electrode 112 may be fabricated over the active layer 104 (and over any optional additional layers of the active region 103) on a side thereof opposite the first electrode 111. As previously mentioned with reference to FIG. 1, the second electrode 112 may be formed to be discontinuous so as to define at least one aperture 114 through which the electromagnetic radiation 102 may pass and enter the active region 103. An antireflective (AR) coating 115 optionally may be formed that extends over the active region 103 at least within any aperture 114 in the second electrode 112.

In the methods described above with reference to FIGS. 5 through 14, the active region 103 of the photoactive device 100 is completely fabricated on the first substrate 142, after which the second substrate 160 is attached to the active region 103 on a side thereof opposite the first substrate 142. In additional embodiments of the present disclosure, a first portion of the active region 103 (including the first active layer 104) may be fabricated on the first substrate 142 to form a first multi-layer structure, and a second portion of the active region 103 may be separately fabricated on the second substrate 160 to form a separate, second multi-layer structure, after which the first and second multi-layer structures may be directly bonded to one another.

Figure 15:
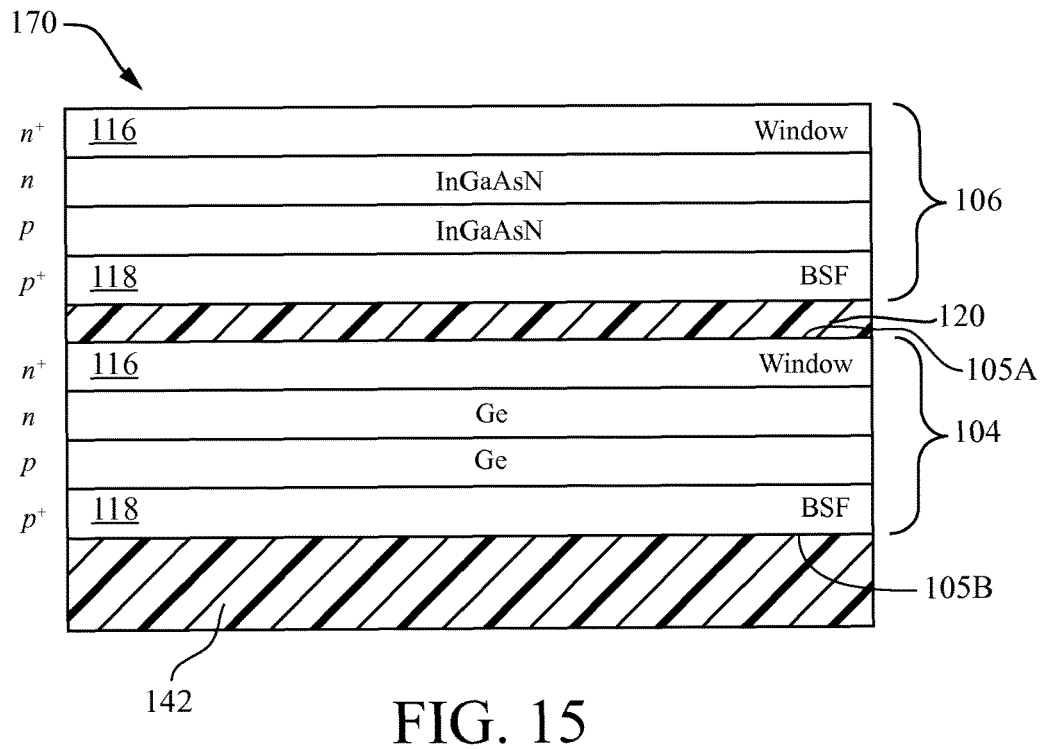

For example, the multi-layer structure shown in FIG. 8 may be fabricated as previously described herein with reference to FIGS. 5 through 8. Referring to FIG. 15, additional layers of the active region 103 (FIG. 1) may be grown over the structure of FIG. 8 to form a first multi-layer structure 170. As a non-limiting example, a tunnel junction layer 120 may be grown over the first active layer 104, and the second active layer 106 may be grown over the tunnel junction layer 120 to form the first multi-layer structure 170.

Figure 16:
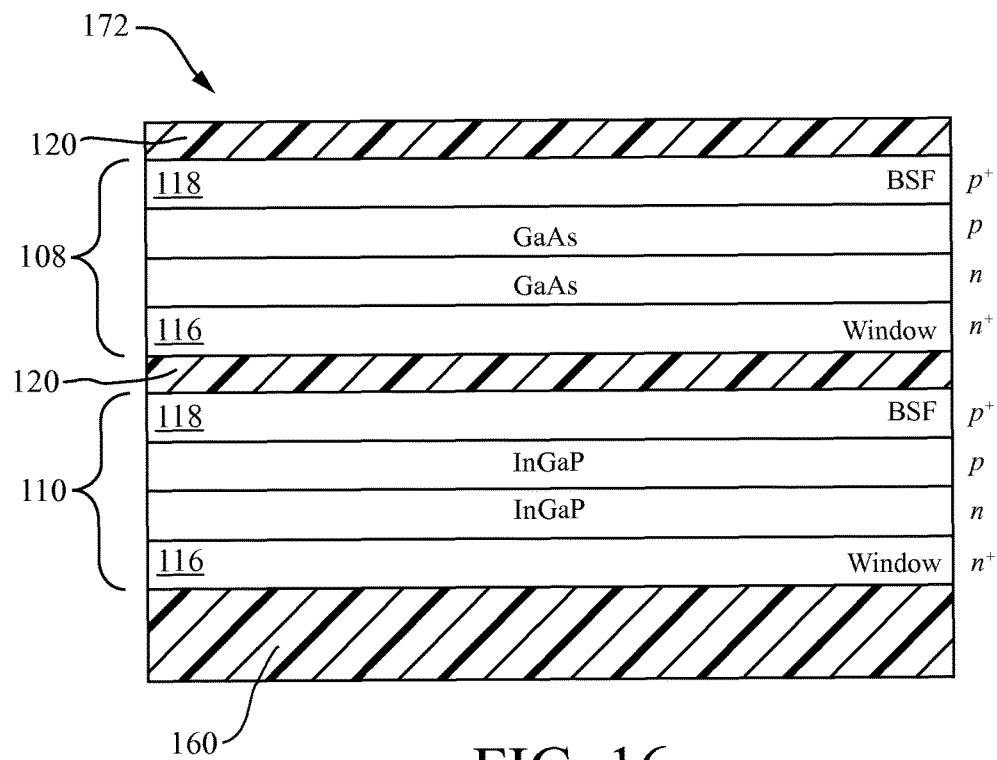

Referring to FIG. 16, a second multi-layer structure 172 may be separately fabricated by forming the fourth active layer 110, the third active layer 108, and tunnel junction layers 120 over a surface of the second substrate 160. The second substrate 160 may be as previously described with reference to FIG. 10. The various layers of the active region 103 formed over the second substrate 160 also may be formed using methods as previously described with reference to FIGS. 8 and 9.

Figure 17:
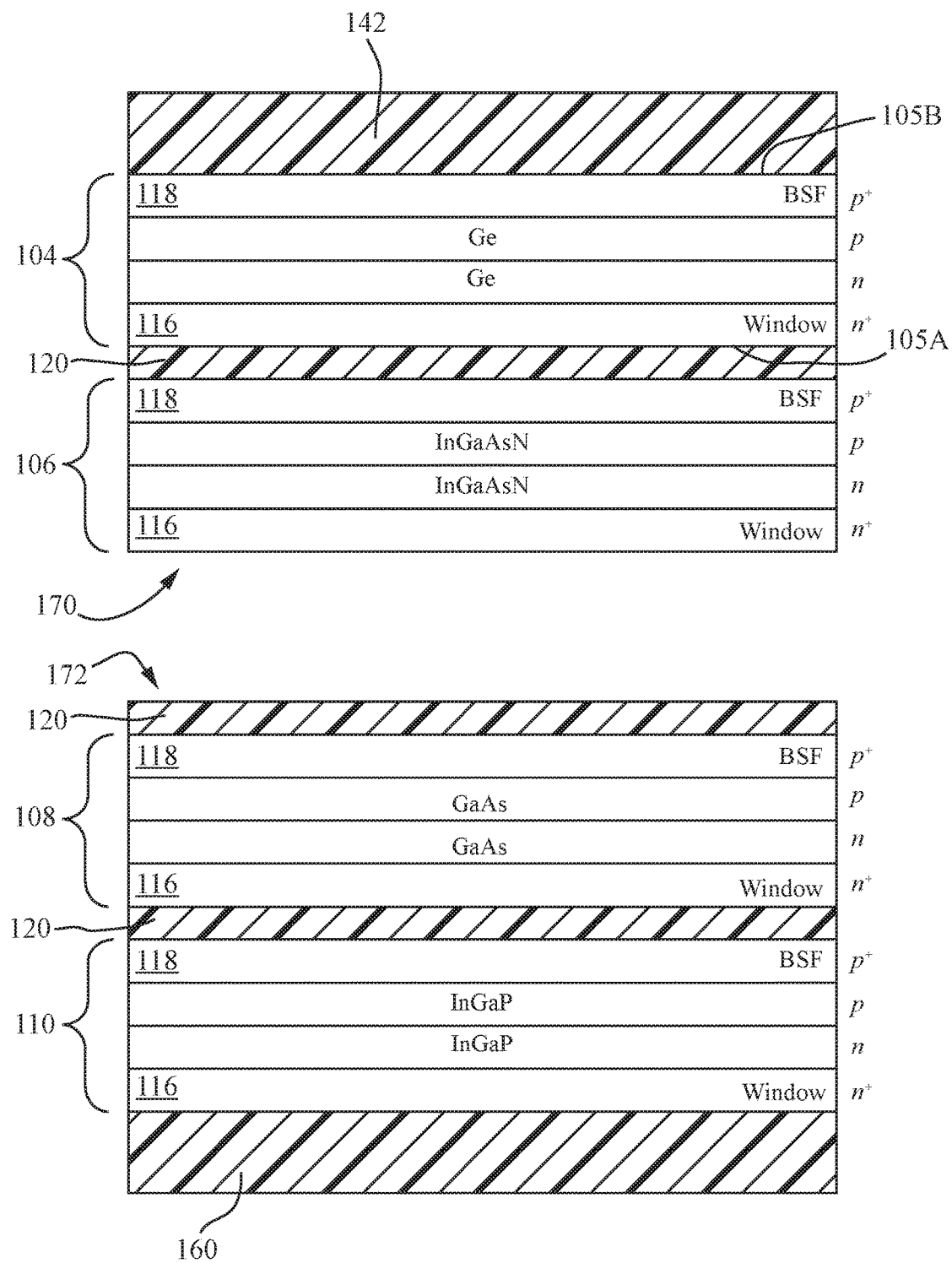
FIG. 17 illustrates the multi-layer structure of FIG. 15 being directly bonded to the multi-layer structure of FIG. 16 to form a structure like that shown in FIG. 10.

As shown in FIG. 17, the first multi-layer structure 170 may be directly bonded to the second multi-layer structure 172 after separately forming the multi-layer structures 170, 172. A direct bonding process as previously described herein may be employed to directly bond the first multi-layer structure 170 to the second multi-layer structure 172. A structure like that of FIG. 10 may be formed upon directly bonding the first multi-layer structure 170 to the second multi-layer structure 172, and the resulting structure then may be processed as previously described with reference to FIGS. 10 through 14 to complete fabrication of a photoactive device 100 as described with reference to FIGS. 1 through 4.

Although the first multi-layer structure 170 of FIG. 15 is described as including the first and second active layers 104, 106, and the second multi-layer structure 172 of FIG. 16 is described as including the third and fourth active layers 108, 110, the first multi-layer structure 170 may include any one or more layers of the active region 103 of the photoactive device 100 (FIG. 1), and the second multi-layer structure 172 may include the remainder of the layers of the active region 103 of the photoactive device 100.

Methods as described above with reference to FIGS. 15 through 17 may be of particular utility in instances where it is desirable to fabricate one or more of the layers of the active region 103 (e.g., active layers 104, 106, 108, 110 and tunnel junction layers 120) using one growth technique, such as a chemical vapor deposition (CVD) technique (e.g., a metalorganic vapor phase epitaxy (MOVPE) technique), and desirable to fabricate one or more other layers of the active region 103 using another, different growth technique, such as a molecular beam epitaxy (MBE) technique. Examples of such methods are disclosed in further detail in, for example, French Patent Application No. 1159154, which was filed Oct. 11, 2011 in the name of Krause and entitled "Multi junctions in a semiconductor device formed by different deposition techniques," the disclosure of which is incorporated herein in its entirety by this reference.

Additional non-limiting examples of embodiments of the disclosure are set forth below.

Embodiment 1: A photoactive device, comprising: a first electrode; a second electrode; and an active region disposed between the first electrode and the second electrode, the active region configured to absorb radiation impinging on the active region and generate a voltage between the first electrode and the second electrode responsive to absorption of radiation, the active region including at least one active layer comprising a semiconductor material exhibiting a bandgap of between about 0.60 eV and about 2.10 eV, the at least one active layer having a front surface through which radiation enters the at least one active layer during operation of the photoactive device and a back surface on an opposing side of the at least one active layer from the front surface, the back surface having a surface roughness greater than a surface roughness of the front surface.

Embodiment 2: The photoactive device of Embodiment 1, wherein the back surface has a topography configured to reflect radiation impinging on the back surface from within the at least one active layer.

Embodiment 3: The photoactive device of Embodiment 2, wherein the topography of the back surface includes a plurality of texture features having an average cross-sectional dimension in a plane parallel to the at least one active layer, the average cross-sectional dimension being between about one hundred nanometers (100 nm) and about fifty microns (50 μm).

Embodiment 4: The photoactive device of Embodiment 3, wherein the plurality of texture features comprises a plurality of recesses extending into the at least one active layer, the plurality of recesses having an average cross-sectional dimension in a plane perpendicular to the at least one active layer between about ten nanometers (10 nm) and about ten microns (10 μm).

Embodiment 5: The photoactive device of Embodiment 3 or Embodiment 4, wherein the plurality of texture features comprises a plurality of protrusions extending out from the at least one active layer from a major plane of the back surface, the plurality of protrusions having an average cross-sectional dimension in a plane perpendicular to the at least one active layer between about ten nanometers (10 nm) and about ten microns (10 μm).

Embodiment 6: The photoactive device of any one of Embodiments 1 through 5, wherein the at least one active layer has an actual average layer thickness of about one hundred microns (100 μm) or less.

Embodiment 7: The photoactive device of Embodiment 6, wherein the at least one active layer has a composition such that electrons generated within the at least one active layer responsive to absorption of radiation exhibit an average diffusion length greater than the actual average layer thickness of the at least one active layer.

Embodiment 8: The photoactive device of Embodiment 6 or Embodiment 7, wherein the actual average layer thickness is about ten microns (10 μm) or less.

Embodiment 9: The photoactive device of any one of Embodiments 1 through 8, wherein the at least one active layer includes at least one p-type dopant.

Embodiment 10: The photoactive device of Embodiment 9, wherein a concentration of the at least one p-type dopant within the at least one active layer exhibits a concentration gradient across the at least one active layer, the concentration of the at least one p-type dopant within the at least one active layer decreasing in a direction extending from the back surface to the front surface.

Embodiment 11: The photoactive device of any one of Embodiments 1 through 10, wherein the semiconductor material of the least one active layer comprises germanium.

Embodiment 12: The photoactive device of Embodiment 11, wherein the semiconductor material of the least one active layer is at least substantially comprised of monocrystalline epitaxial germanium.

Embodiment 13: The photoactive device of any one of Embodiments 1 through 12, wherein one of the first electrode and the second electrode comprises a metal in direct physical contact with the back surface of the at least one active layer.

Embodiment 14: The photoactive device of any one of Embodiments 1 through 13, wherein the photoactive device comprises a solar cell.

Embodiment 15: The photoactive device of Embodiment 14, wherein the solar cell comprises a multi junction solar cell, and wherein the active region further includes at least one additional active layer comprising a different semiconductor material exhibiting a bandgap greater than about 1.20 eV.

Embodiment 16: A method of fabricating a photoactive device, comprising: forming an active region and configuring the active region to absorb radiation impinging on the active region and to generate a voltage between a first electrode and a second electrode responsive to absorption of radiation, the active region including at least one active layer comprising a semiconductor material exhibiting a bandgap of between about 0.60 eV and about 2.10 eV, the at least one active layer having a front surface through which radiation enters the at least one active layer during operation of the photoactive device and a back surface on an opposing side of the at least one active layer from the front surface, the back surface having a surface roughness greater than a surface roughness of the front surface; and forming the first electrode and the second electrode between which a voltage is generated responsive to absorption of radiation impinging on the active region.

Embodiment 17: The method of Embodiment 16, wherein forming the active region further comprises: forming the at least one active layer on a surface of a first substrate such that the back surface of the at least one active layer is disposed adjacent the first substrate; removing first substrate from the at least one active layer and exposing the back surface of the at least one active layer; and processing the back surface of the at least one active layer after removing the first substrate from the at least one active layer and causing the back surface to have the surface roughness greater than the surface roughness of the front surface.

Embodiment 18: The method of Embodiment 17, further comprising attaching a second substrate over the at least one active layer on a side thereof opposite the first substrate prior to removing the first substrate from the at least one active layer.

Embodiment 19: The method of Embodiment 18, further comprising forming at least one additional active layer of the active region on the second substrate prior to attaching the second substrate over the at least one active layer on the side thereof opposite the first substrate.

Embodiment 20: The method of any one of Embodiments 17 through 19, wherein processing the back surface of the at least one active layer after removing the first substrate from the at least one active layer comprises at least one of chemically etching the back surface and mechanically roughening the back surface.

Embodiment 21: The method of Embodiment 20, wherein processing the back surface of the at least one active layer after removing the first substrate from the at least one active layer comprises chemically etching the back surface with at least one of a wet chemical etchant and a dry plasma etchant.

Embodiment 22: The method of Embodiment 20 or Embodiment 21, wherein processing the back surface of the at least one active layer after removing the first substrate from the at least one active layer comprises subjecting the back surface to a chemical-mechanical polishing (CMP) process.

Embodiment 23: The method of any one of Embodiments 17 through 22, wherein forming the at least one active layer on the surface of the first substrate comprises: transferring a first layer comprising the semiconductor material of the at least one active layer to the first substrate; and epitaxially growing an additional layer comprising the semiconductor material on the first layer to increase a thickness of the at least one active layer.

Embodiment 24: The method of any one of Embodiments 16 through 23, further comprising doping the at least one active layer with at least one p-type dopant.

Embodiment 25: The method of Embodiment 24, wherein doping the at least one active layer with at least one p-type dopant comprises doping the at least one active layer with the at least one p-type dopant such that a concentration of the at least one p-type dopant within the at least one active layer exhibits a concentration gradient across the at least one active layer, the concentration of the at least one p-type dopant within the at least one active layer decreasing in a direction extending from the back surface to the front surface.

The example embodiments of the disclosure described above do not limit the scope of the invention, since these embodiments are merely examples of embodiments of the invention, which is defined by the scope of the appended claims and their legal equivalents. Any equivalent embodiments are intended to be within the scope of this invention. Indeed, various modifications of the disclosure, in addition to those shown and described herein, such as alternative useful combinations of the elements described, will become apparent to those skilled in the art from the description. Such modifications and embodiments are also intended to fall within the scope of the appended claims.

What is claimed is:

1. A method of fabricating a photoactive device, comprising the steps of:
    transferring a first layer of material from a donor structure onto a surface of a first substrate, the first layer of material comprising a semiconductor material comprising germanium and a thickness of about 1.50 μm or less, the semiconductor material exhibiting a bandgap of between about 0.60 eV and about 2.10 eV;
    epitaxially growing at least one additional layer of material on the first layer of material to increase a thickness of the first layer of material and form a first active layer comprising a semiconductor material exhibiting a bandgap of between about 0.60 eV and about 2.10 eV, the first active layer having a front surface through which radiation enters during operation of the photoactive device and a back surface on an opposing side of the first active layer from the front surface;
    forming a second active layer comprising a III-V semiconductor material over the first active layer;
    forming a third active layer over the second active layer;
    forming a fourth active layer over the third active layer, wherein each of the second active layer, the third active layer and the fourth active layer comprises a p-n junction;
    attaching a second substrate over the fourth active layer on a side thereof opposite the first substrate such that the first active layer, the second active layer, the third active layer, and the fourth active layer form an active region provided between the first substrate and the second substrate;
    removing the first substrate from the active region and exposing the back surface of the first active layer;
    processing the back surface of the first active layer after removing the first substrate and causing the back surface to have a surface roughness greater than the surface roughness of the front surface of the first active layer;
    forming a first electrode on the roughened back surface of the first active layer; and forming a second electrode over the fourth active layer.

2. The method of claim 1, wherein the step of transferring the first layer of material from the donor structure onto the surface of the first substrate comprises transferring monocrystalline germanium from the donor structure onto the surface of the first substrate.

3. The method of claim 1, wherein the first layer of material has a thickness of about 1 μm or less.

4. The method of claim 1, wherein the step of processing the back surface of the first active layer after removing the first substrate comprises at least one of chemically etching the back surface and mechanically roughening the back surface.

5. The method of claim 1, wherein the step of epitaxially growing the at least one additional layer of material on the first layer of material to increase the thickness of the first layer of material and form the first active layer comprises forming the first active layer to have a thickness of about ten microns (10 μm) or less.

6. The method of claim 1, further comprising doping the first active layer with at least one p-type dopant.

7. The method of claim 6, wherein the step of doping the first active layer with the at least one p-type dopant comprises doping the first active layer with the at least one p-type dopant such that a concentration of the at least one p-type dopant within the first active layer exhibits a concentration gradient across the first active layer, the concentration of the at least one p-type dopant within the first active layer decreasing in a direction extending from the back surface to the front surface.

8. The method of claim 1, further comprising configuring a topography of the back surface to reflect radiation impinging on the back surface from within the first active layer.

9. The method of claim 8, wherein the step of configuring the topography of the back surface to reflect radiation impinging on the back surface from within the first active layer further comprises forming a plurality of texture features having an average cross-sectional dimension in a plane parallel to the first active layer, the average cross-sectional dimension being between about one hundred nanometers (100 nm) and about fifty microns (50 μm).

10. The method of claim 1, further comprising forming the first active layer to have an average layer thickness of about one hundred microns (100 μm) or less.

11. The method of claim 1, further comprising formulating a composition of the first active layer such that electrons generated within the first active layer responsive to absorption of radiation exhibit an average diffusion length greater than the average layer thickness of the first active layer.

12. The method of claim 1, further comprising selecting the semiconductor material of the first layer of material to comprise monocrystalline epitaxial germanium.

13. The method of claim 1, wherein the step of epitaxially growing the at least one additional layer of material on the first layer of material comprises epitaxially growing an additional material comprising germanium and having the same composition as the first layer of material.

14. The method of claim 1, wherein the first active layer comprises a semiconductor material exhibiting a bandgap of between about 0.60 eV and about 0.80 eV.

15. The method of claim 14, further comprising forming the first active layer to have a thickness of about 11.0 μm or less, and forming the first active layer to have a composition such that electrons generated within the first active layer responsive to absorption of photons of electromagnetic radiation exhibit an average diffusion length greater than the thickness of the first active layer.

16. The method of claim 15, further comprising forming the back surface to include texture features having average cross-sectional dimensions sized so as to result in increased reflections of radiation having wavelengths in the range extending from about 1,550 nm to about 1,800 nm from the back surface and back into the first active layer.

\* \* \* \* \*